(12) United States Patent
Jang et al.

(10) Patent No.: US 11,910,663 B2
(45) Date of Patent: Feb. 20, 2024

(54) DISPLAY PANEL WITH PAD HOLE

(71) Applicant: Samsung Display Co., Ltd., Yongin-Si (KR)

(72) Inventors: Daehwan Jang, Seoul (KR); Yunjong Yeo, Hwaseong-si (KR); Jaebeen Lee, Seoul (KR); Sungwon Cho, Hwaseong-si (KR); Jin Ho Cho, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 82 days.

(21) Appl. No.: 17/235,224

(22) Filed: Apr. 20, 2021

(65) Prior Publication Data

US 2022/0028953 A1 Jan. 27, 2022

(30) Foreign Application Priority Data

Jul. 27, 2020 (KR) .................. 10-2020-0093317

(51) Int. Cl.
| | |
|---|---|
| *H10K 59/131* | (2023.01) |
| *G09G 3/3225* | (2016.01) |
| *H10K 50/844* | (2023.01) |
| *H10K 59/122* | (2023.01) |
| *H10K 71/00* | (2023.01) |
| *H10K 59/12* | (2023.01) |

(52) U.S. Cl.
CPC ......... *H10K 59/131* (2023.02); *G09G 3/3225* (2013.01); *H10K 50/844* (2023.02); *H10K 59/122* (2023.02); *H10K 71/00* (2023.02); *H10K 59/1201* (2023.02)

(58) Field of Classification Search
CPC ............... H10K 59/131; H10K 59/122; H10K 59/1201; H10K 71/00; H10K 50/844; G09G 3/3225
USPC ...................................... 257/40, 59
See application file for complete search history.

(56) References Cited

U.S. PATENT DOCUMENTS

| | | | |
|---|---|---|---|
| 8,941,216 B2 | 1/2015 | Lee et al. | |
| 9,030,376 B2 | 5/2015 | Kim et al. | |
| 10,297,784 B2* | 5/2019 | Matsueda | ............ H10K 77/111 |
| 2003/0173890 A1* | 9/2003 | Yamazaki | ........... G02F 1/16766 |
| | | | 313/498 |

(Continued)

FOREIGN PATENT DOCUMENTS

| | | |
|---|---|---|
| CN | 110165076 A | 8/2019 |
| EP | 3624199 A2 | 3/2020 |

(Continued)

OTHER PUBLICATIONS

European Examination Report for Application No. 21 187 337.7-1212 dated Dec. 21, 2023.

*Primary Examiner* — Lex H Malsawma
*Assistant Examiner* — Eric W Jones
(74) *Attorney, Agent, or Firm* — CANTOR COLBURN LLP

(57) ABSTRACT

A display panel includes a pad line disposed on a rear surface of a base layer and a connection line disposed on a front surface of the base layer. The pad line and the connection line are connected in an area overlapping a pad hole defined to pass through the base layer, and the pad line is connected to a driving unit on the rear surface of the base layer.

15 Claims, 21 Drawing Sheets

(56) References Cited

U.S. PATENT DOCUMENTS

| | | | |
|---|---|---|---|
| 2010/0148209 A1* | 6/2010 | Hatano | H10K 59/131 |
| | | | 257/E33.053 |
| 2014/0375916 A1* | 12/2014 | Chen | H01L 27/1218 |
| | | | 349/33 |
| 2016/0028043 A1* | 1/2016 | Kwon | H10K 50/844 |
| | | | 257/40 |
| 2017/0179159 A1 | 6/2017 | Kawata et al. | |
| 2017/0338250 A1 | 11/2017 | Yanaka et al. | |
| 2017/0364726 A1* | 12/2017 | Buchan | H10N 30/40 |
| 2018/0159069 A1* | 6/2018 | Matsueda | H10K 50/84 |
| 2019/0035820 A1* | 1/2019 | Yanaka | H10K 59/1213 |
| 2019/0198573 A1* | 6/2019 | Kim | H10K 50/86 |
| 2019/0363264 A1 | 11/2019 | Kishimoto et al. | |
| 2020/0388790 A1* | 12/2020 | Yamazaki | H10K 59/122 |
| 2021/0336210 A1 | 10/2021 | Zhou | |

FOREIGN PATENT DOCUMENTS

| | | |
|---|---|---|
| JP | 2006040581 A | 2/2006 |
| KR | 101157425 B1 | 6/2012 |
| KR | 101308295 B1 | 9/2013 |
| KR | 101867961 B1 | 6/2018 |
| KR | 1020190068112 A | 6/2019 |

\* cited by examiner

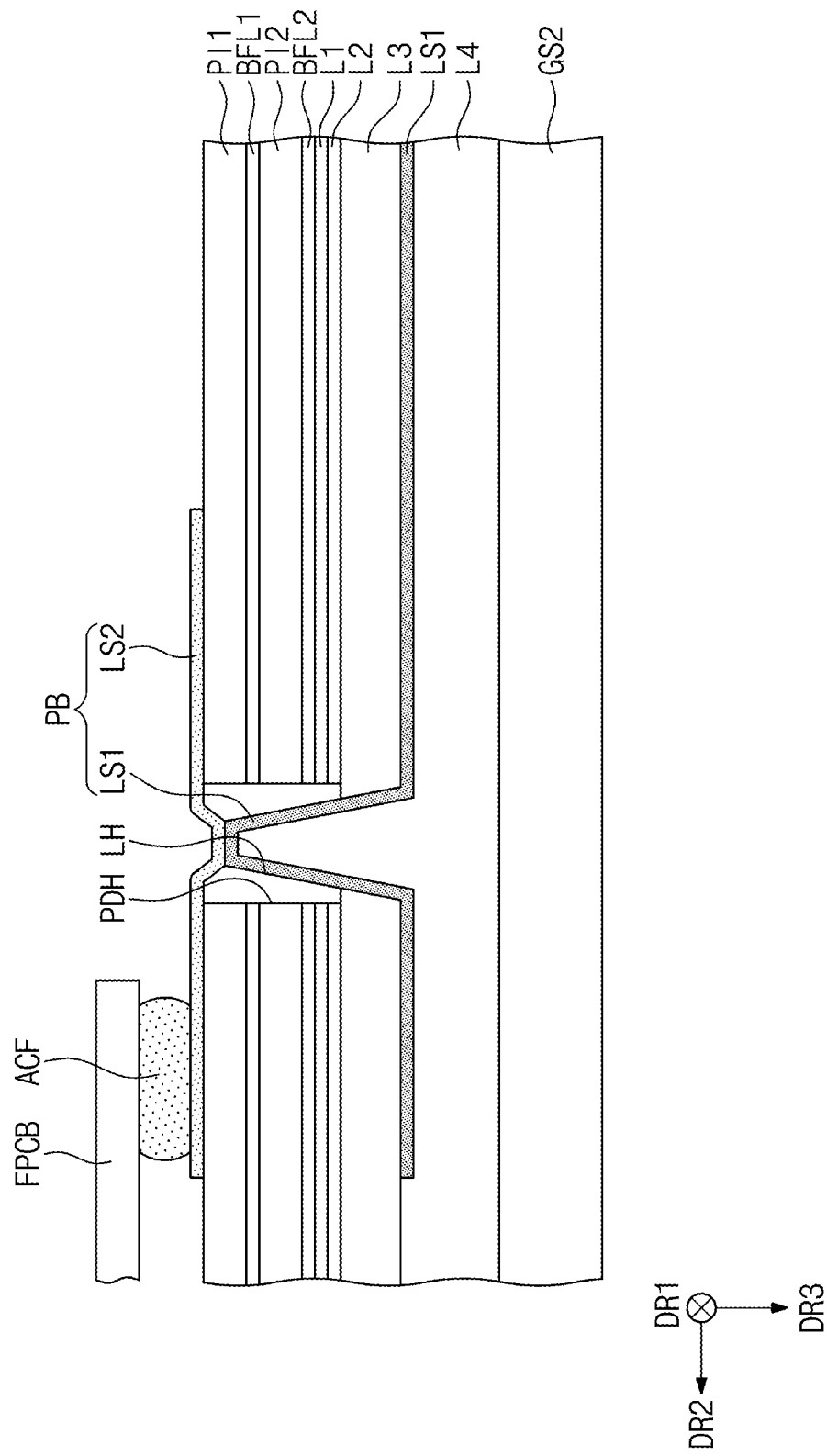

DISPLAY PANEL WITH PAD HOLE

This application claims priority to Korean Patent Application No. 10-2020-0093317, filed on Jul. 27, 2020, and all the benefits accruing therefrom under 35 U.S.C. § 119, the content of which in its entirety is herein incorporated by reference.

BACKGROUND

The present disclosure herein relates to a display panel, and more particularly, to a display panel having improved reliability.

A display panel connects a circuit board for driving pixels. The connection of the display panel to the circuit board, for example, is achieved through a tape automated bonding ("TAB") mounting process which uses an anisotropic conductive film ("ACF") to bond a flexible circuit board to a display panel.

SUMMARY

The present disclosure provides a display panel having improved aesthetics by including a circuit board bonded to a rear surface of the display panel.

An embodiment of the inventive concept provides a display panel including a display unit having an active area displaying an image, and a driving unit connected to the display unit. The display unit includes a base layer having a front surface and a rear surface opposing each other, a circuit element layer disposed on the front surface of the base layer and including a plurality of insulating layers and a transistor having a plurality of electrodes disposed between the insulating layers, a display element layer disposed on the circuit element layer and including a light emitting element connected to the transistor, and a pad unit including a connection line branched from an electrode of the plurality of electrodes and a pad line connected to the driving unit. The display unit defines a pad hole passing through the base layer and at least one insulating layer of the plurality of insulating layers, a third insulating layer of the plurality of insulating layers covers side surfaces of the at least one insulating layer defining the pad hole, is different from the at least one insulating layer, and defines an insulating hole passing through the third insulating layer, and the connection line and the pad line are in contact with each other inside the insulating hole.

The pad line may be disposed on the rear surface of the base layer.

An angle between a virtual line parallel to an upper surface of the third insulating layer and a side surface of the third insulating layer defining the insulating hole may be about 50 degrees)(°) to about 80°.

The connection line may extend along the shape of the insulating hole, and among the plurality of insulating layers, a fourth insulating layer disposed on the third insulating layer may filled a space on the connection line and inside the insulating hole.

The connection line may be filled inside the insulating hole.

The base layer may include an organic insulating layer containing an organic material, and an inorganic insulating layer disposed on the organic insulating layer and containing an inorganic material, and a side surface of the organic insulating layer and a side surface of the inorganic insulating layer, which define the pad hole may be aligned with each other.

The base layer may include a first organic insulating layer and a second organic insulating layer which contain an organic material, and a first inorganic insulating layer and the second organic insulating layer which contain an inorganic material, the first inorganic insulating layer may be disposed between the first organic insulating layer and the second organic insulating layer, and a second inorganic insulating layer may be disposed on the second organic insulating layer, and a side surface of the first organic insulating layer, a side surface of the first inorganic insulating layer, a side surface of the second organic layer, and a side surface of the second inorganic insulating layer, which define the pad hole, may be aligned with one another.

The pad unit and the driving unit may be connected in the rear surface of the base layer overlapping the active area.

The driving unit may be provided in plurality in the display unit, and the display unit may be provided in plurality to be arranged along a first direction and a second direction crossing the first direction.

The display panel may further include a cover layer which seals the display element layer and the circuit element layer, and the cover layer may be filled between the plurality of display units.

The display panel may further include a light control layer disposed on the display element layer, and the light control layer may include a color control layer and a color filter layer. The color layer may be configured to control a wavelength of light generated from the light emitting element and contain quantum dots, and the color filter layer may be disposed on the color control layer and configured to transmit the controlled light.

The display element layer may further include a first partition wall and a second partition wall which are disposed on the circuit element layer, each extending in a first direction, and spaced apart along a second direction crossing the first direction, a first electrode disposed on the first partition wall and connected to the transistor, a second electrode disposed on the second partition wall, and the light emitting element.

The light emitting element may be disposed between the first partition wall and the second partition wall and connected to the first electrode and the second electrode.

The display element layer may further include a pixel defining film disposed on the circuit element layer and having a display opening defined, a first electrode at least partially exposed by the display opening, a hole control layer disposed on the first electrode, the light emitting element disposed on the first electrode, a second electrode disposed on the light emitting element, and an encapsulation layer which covers the second electrode.

The light emitting element may be an organic light emitting element.

In an embodiment of the inventive concept, a method for manufacturing a display panel includes: providing a plurality of insulating layers, a base layer having a front surface and a rear surface opposing each other, and a first work substrate, where the plurality of insulating layers is formed on the front surface and the first work substrate is formed on the rear surface; removing the plurality of insulating layers and a part of the base layer in a direction from the front surface to the rear surface to form a pad hole; filling the pad hole with an organic layer; removing an area of the organic layer overlapping the pad hole in a plan view to form an insulating hole surrounded by the pad hole; applying a first conductive material onto the organic layer to form a connection line covering the insulating hole; removing the base layer to expose a portion of the connection line overlapping the insulating hole; and applying a second conductive material onto the rear surface to form a pad line, where the connection line and the pad line are in contact with each other inside the insulating hole.

On the rear surface, the method for manufacturing a display panel may further include bonding a driving unit to the pad line.

The pad line and the driving unit may be bonded to each other through an anisotropic conductive film ("ACF").

In the base layer, at least one organic insulating layer including an organic material and at least one inorganic insulating layer including an inorganic material are alternately disposed.

The method for manufacturing a display panel may further include, after the forming of the connection line, forming a planarization layer and a second work substrate on the connection line, and removing the first work substrate from the rear surface.

The connection line may extend along the shape of the insulating hole, and the planarization layer may fill a space on the connection line and inside the insulating hole.

The connection line may be filled inside the insulating hole.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 11H is a cross-sectional view of a method for manufacturing a display panel according to an embodiment of the inventive concept.

DETAILED DESCRIPTION

Figure 1:
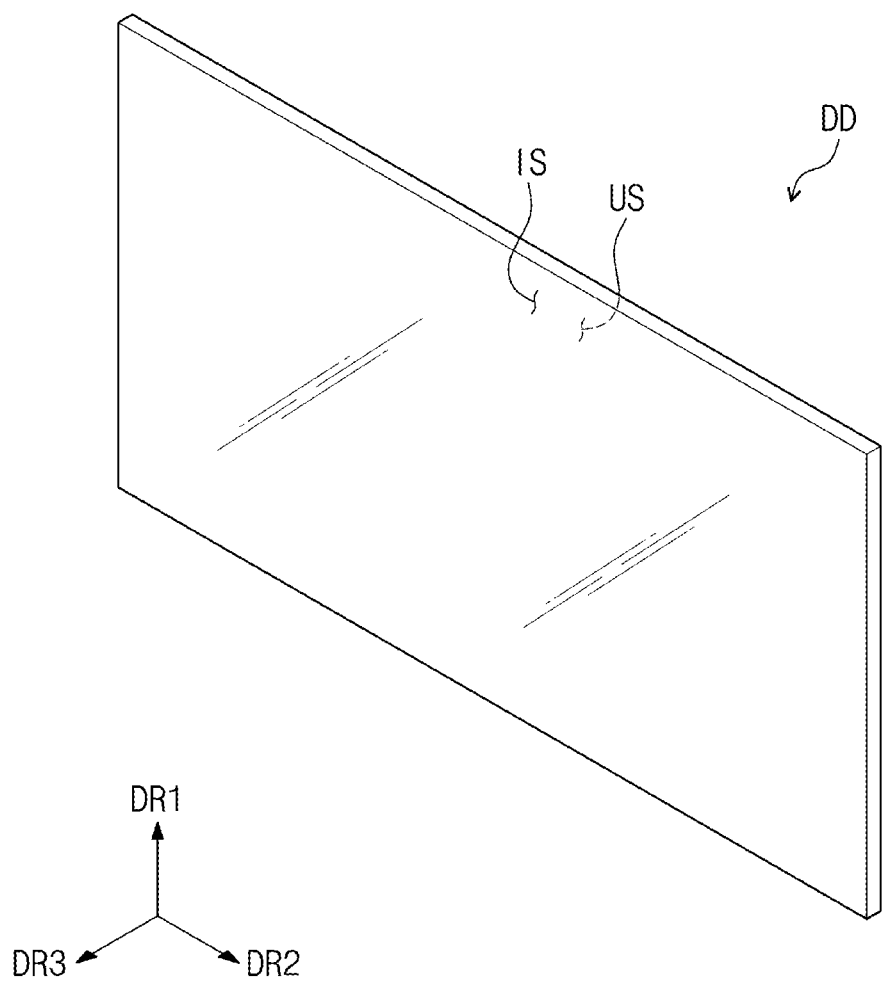
FIG. 1 is a perspective view of a display panel according to an embodiment of the inventive concept.

In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof. Hereinafter, embodiments of the inventive concept will be described with reference to the accompanying drawings.

Figure 2:
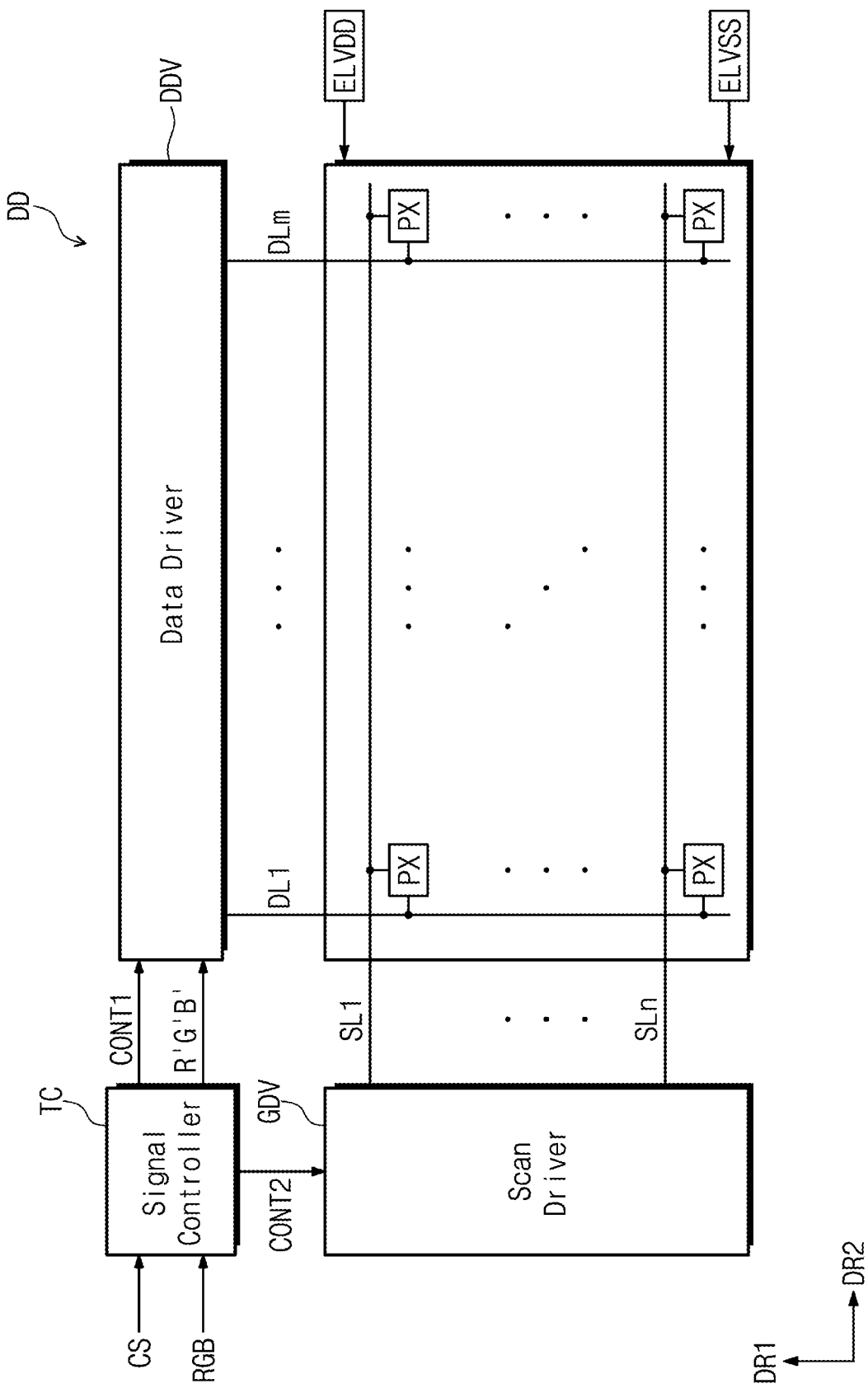
FIG. 2 is a block diagram of a display panel according to an embodiment of the inventive concept.
Figure 3A:
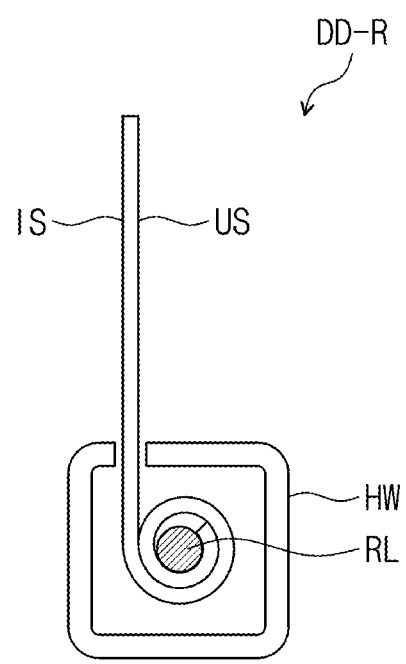
FIG. 3A is a cross-sectional view of a display panel in a rolled state according to an embodiment of the inventive concept.
Figure 3A:
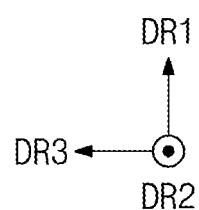
Figure 3B:
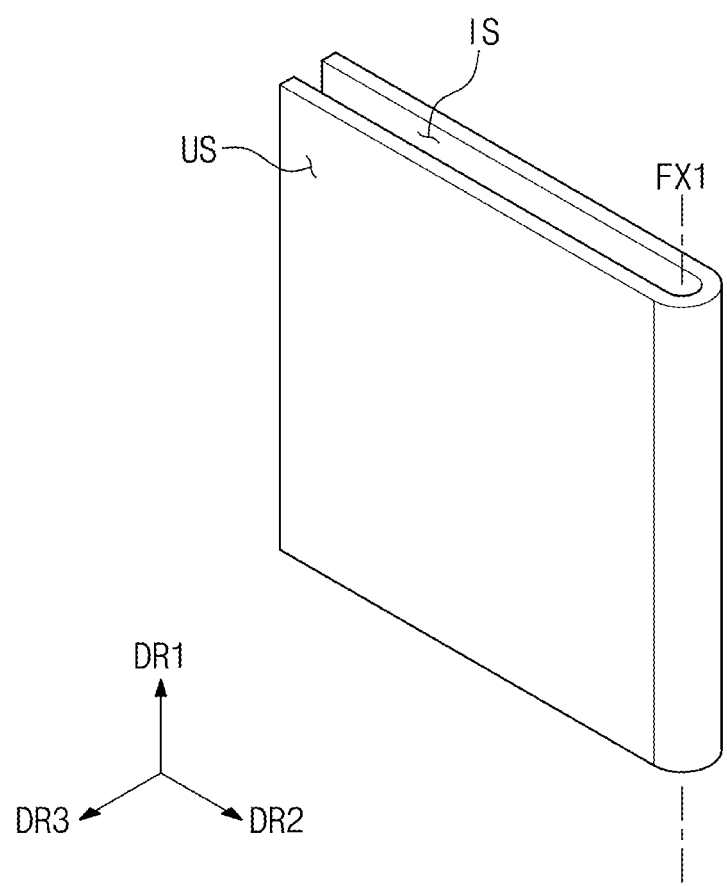
FIG. 3B is a perspective view of a display panel in an in-folded state according to an embodiment of the inventive concept.
Figure 3C:
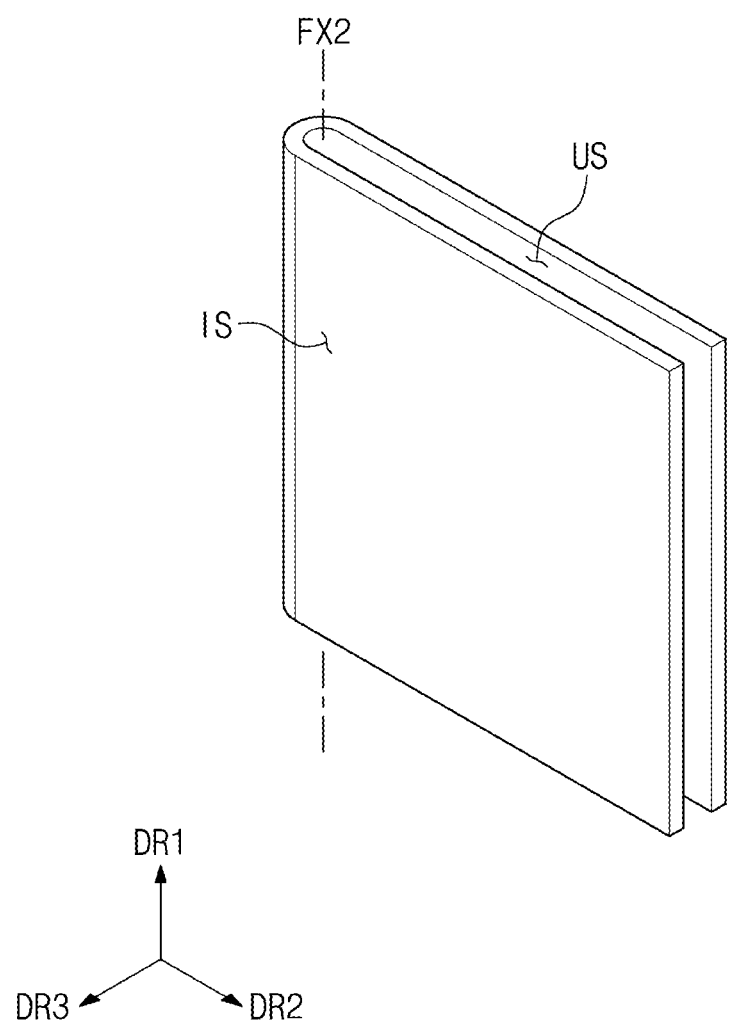
FIG. 3C is a perspective view of a display panel in an out-folded state according to an embodiment of the inventive concept.

FIG. 1 is a perspective view of a display panel according to an embodiment of the inventive concept. FIG. 2 is a block diagram of a display panel according to an embodiment of the inventive concept. FIG. 3A is a cross-sectional view of a display panel in a rolled state according to an embodiment of the inventive concept. FIG. 3B is a perspective view of a display panel in an in-folded state according to an embodiment of the inventive concept. FIG. 3C is a perspective view of a display panel in an out-folded state according to an embodiment of the inventive concept.

A display panel DD may be any one among a liquid crystal display panel, a plasma display panel, an electrophoretic display panel, a microelectromechanical system display panel, an electrowetting display panel, and a light emitting display panel, and when the display panel DD is a light emitting display panel, the light emitting element may include any one of an organic light emitting element or a nano light emitting diode ("LED"), but the invention is not limited to any one embodiment.

Although not shown, a display device may be configured to include a support member and a cover window, which cover the display panel DD to form an exterior, and the shapes of the support member and the cover window are not limited to any on as long as the shapes are formed by combining together to accommodate the display panel DD.

The display panel DD may include a front surface IS and a rear surface US facing the front surface IS. The front surface IS of the display panel DD may correspond to an active area displaying an image. Although not shown, the display panel DD may include a peripheral area surrounding an edge of the front surface IS. Elements for driving pixels may be disposed in the peripheral area. However, in the display panel DD according to the inventive concept, a peripheral area may be omitted, and the display panel DD in which an image is viewed on the entire front surface IS by a user may be provided.

The normal direction of the front surface IS, that is, the thickness direction of the display panel DD is indicated by a third direction DR3. As used herein, a front surface (or an upper surface) and a rear surface (or a lower surface) of respective members which will be described below are separated by the third direction DR3. However, the first to third directions DR1, DR2, and DR3 shown in the present embodiment are merely examples.

In an embodiment of the inventive concept, a display device DD having a planar front surface IS defined by the first direction DR1 and the second direction DR2 is illustrated, but the invention is not limited thereto. In another embodiment, the display device DD may further include a curved display surface or a three-dimensional display surface. The three-dimensional display surface may include a plurality of display areas indicating different directions.

Referring to FIG. 2, the display panel DD may include a signal controller TC or a timing controller, a data driver DDV, and a scan driver GDV. The signal controller TC, the data driver DDV, and the scan driver GDV each may include driving circuits.

The display panel DD may be a subminiature light emitting element display panel DD including a subminiature light emitting element. For example, the display panel DD may be a nano LED display panel DD. In addition, the display panel DD may be a light emitting display panel including an organic light emitting element.

The display panel DD may include a plurality of data lines DL1-DLm, a plurality of scan lines SL1-SLn, and a plurality of pixels PX.

The plurality of data lines DL1-DLm may extend in the first direction DR1 and be arranged along the second direction DR2 crossing the first direction DR1. The plurality of scan lines SL1-SLn may extend in the second direction DR2 and be arranged along the first direction DR1.

The pixels PX each may include a light emitting element and a pixel circuit electrically connected to the light emitting element. The pixel circuit may include a plurality of transistors. A first power voltage ELVDD and a second power voltage ELVSS may be provided to each of the pixels PX.

The pixels PX may be disposed according to predetermined rules on a plane, defined by the first and second directions DR1 and DR2, of the display panel DD. The pixels PX each may display one of primary colors or one of mixed colors. The primary colors may include red, green, and blue, and the mixed colors may include various colors such as yellow, cyan, magenta, and white. However, colors displayed by the pixels PX are not limited thereto.

The signal controller TC receives image data RGB provided from the outside. The signal controller TC converts the image data RGB to conform to the operation of the display panel DD so as to generate converted image data R'G'B', and output the converted image data R'G'B' to the data driver DDV.

In addition, the signal controller TC may receive a control signal CS provided from the outside (e.g., external graphic controller). The control signal CS may include a vertical synchronization signal, a horizontal synchronization signal, a main clock signal, and a data enable signal. The signal controller TC provides a first control signal CONT1 to the data driver DDV, and provides a second control signal CONT2 to the scan driver GDV. The first control signal CONT1 is a signal for controlling the data driver DDV, and the second control signal CONT2 is a signal for controlling the scan driver GDV.

The data driver DDV may provide an electrical signal to the plurality of data lines DL1-DLm in response to the first control signal CONT1 received from the signal controller TC. The data driver DDV may be implemented as an independent integrated circuit to be electrically connected to one side of the display panel DD, or to be directly mounted on the display panel DD. In addition, the data driver DDV may be implemented as a single chip, or may include a plurality of chips.

The scan driver GDV may provide an electrical signal to the scan lines SL1-SLn in response to the second control signal CONT2 received from the signal controller TC. The scan driver GDV may be integrated in a predetermined area of the display panel DD. For example, the scan driver GDV may include a plurality of thin film transistors formed through the same process as the driving circuit of the pixels PX, for example, a low temperature polycrystalline silicon ("LTPS") process or a low temperature polycrystalline oxide ("LTPO") process. In addition, in another embodiment of the inventive concept, the scan driver GDV may be implemented as an independent integrated circuit chip to be electrically connected to one side of the display panel DD.

FIG. 2 illustrates a single scan driver GDV disposed on the left side centered on an area in which the pixels PX are disposed, but the embodiment of the inventive concept is not limited thereto. The scan driver GDV may be provided in plurality to be disposed on the left and right sides centered on an area in which the pixels PX are disposed. In this case, a difference in charging rate is reduced compared to when one scan driver GDV is included, and image quality deterioration caused by the difference in charging rate may be prevented.

While a gate-on voltage is applied to one of the plurality of scan lines SL1-SLn, a switching transistor of each of the pixels in one row connected thereto is turned on. In this case, the data driver DDV provides data driving signals to the data lines DL1-DLm. The data driving signals supplied to the data lines DL1-DLm are applied to the corresponding pixels through the turned-on switching transistors. The data driving signals may be analog voltages corresponding to gray-scale values of image data.

Referring to FIG. 3A, the display panel according to the inventive concept may be a rollable display panel DD-R. When the display panel DD-R has a rollable characteristic, a housing HW may be included as a support member of a display device.

The display panel DD-R may be stored inside the housing HW in a rolled state. The display panel DD-R may be rolled or unfolded through a roller RL disposed inside the housing HW.

A rotation direction of the roller RL when the display panel DD-R is wound around the roller RL and a rotation direction of the roller RL when the display panel DD-R is unwound may be opposite to each other. That is, if the roller RL rotates in a forward direction when the display panel DD-R is wound around the roller RL, the roller RL may rotate in a reverse direction when the display panel DD-R is released from the roller RL.

According to the inventive concept, a separate mechanical configuration (not shown) for automatically unfolding the display panel DD-R wound around the roller RL and supporting the unfolded display panel DD-R to keep the state in use may be further provided.

Referring to FIG. 3B, the display panel DD according to an embodiment includes a virtual first folding axis FX1 extending in the first direction DR1. The first folding axis FX1 may extend along the first direction DR1 on the front surface IS.

The display panel DD may be folded with respect to the first folding axis FX1 to be transformed into an in-folding state in which other areas of the front surface IS, which are active areas, face each other.

Referring to FIG. 3C, the display panel DD according to an embodiment includes a virtual second folding axis FX2 extending in the first direction DR1. The second folding axis FX2 may extend along the first direction DR1 on the rear surface US.

The display panel DD may be folded with respect to the second folding axis FX2 to be transformed into an out-folding state in which other areas of the rear surface US face each other.

However, the embodiment of the inventive concept is not limited thereto, and the display panel DD may be folded with respect to a plurality of folding axes such that a part of each of the front surface IS and the rear surface US may face each other, and the number of folding axes according to the invention is not limited to any one embodiment.

Figure 4A:
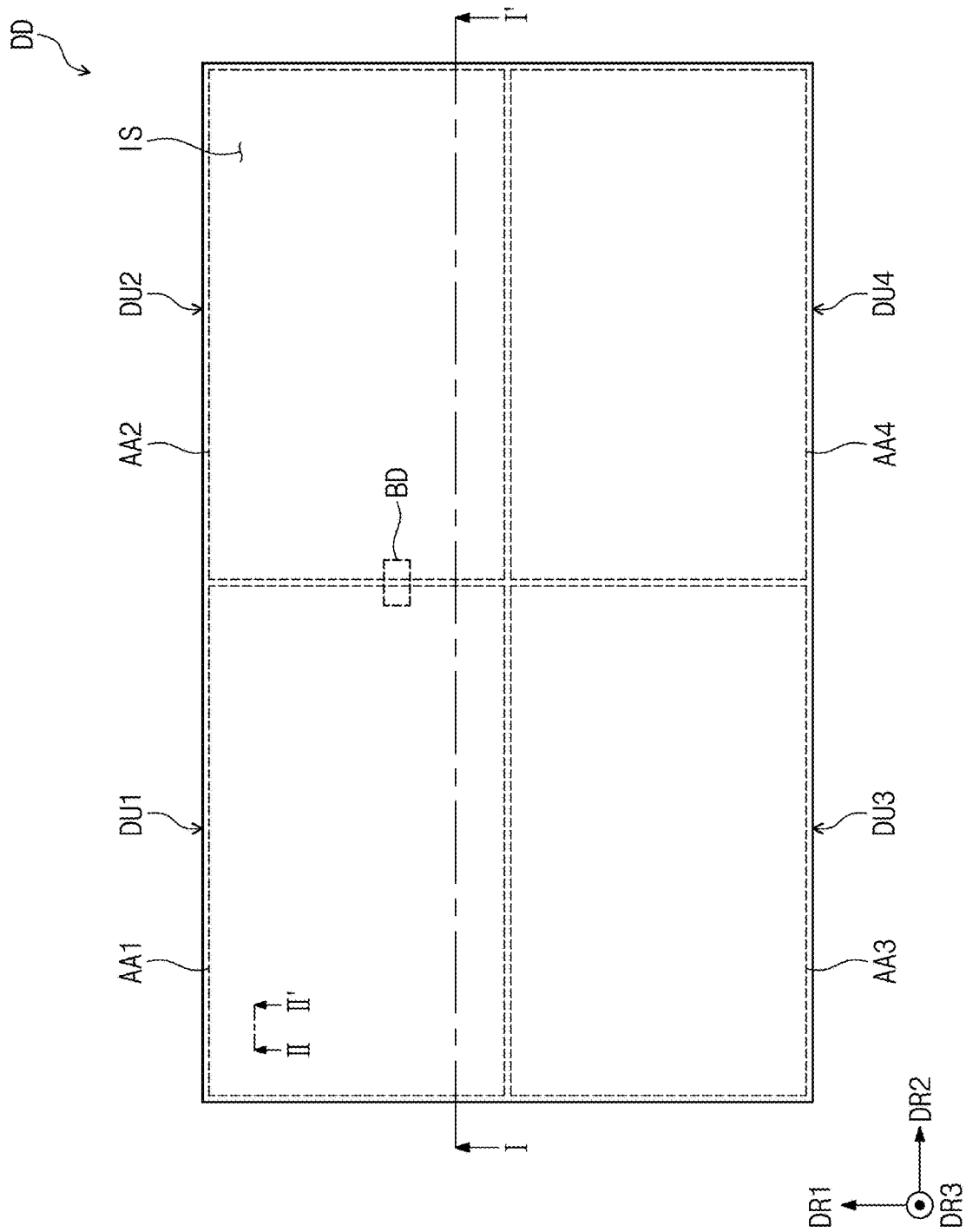
FIG. 4A is a plan view of a display panel according to an embodiment of the inventive concept.
Figure 4B:
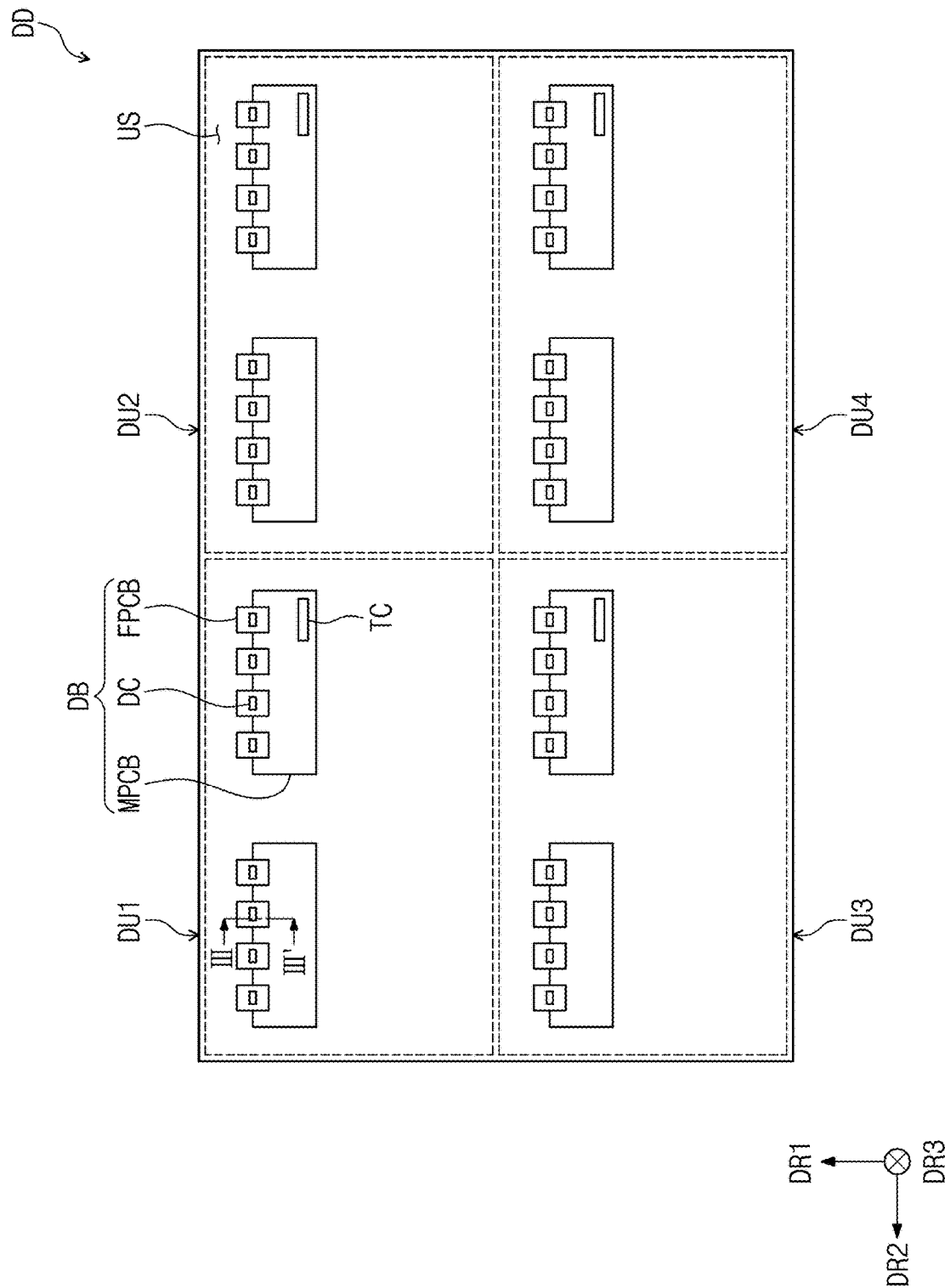
FIG. 4B is a rear view of a display panel according to an embodiment of the inventive concept.
Figure 5:
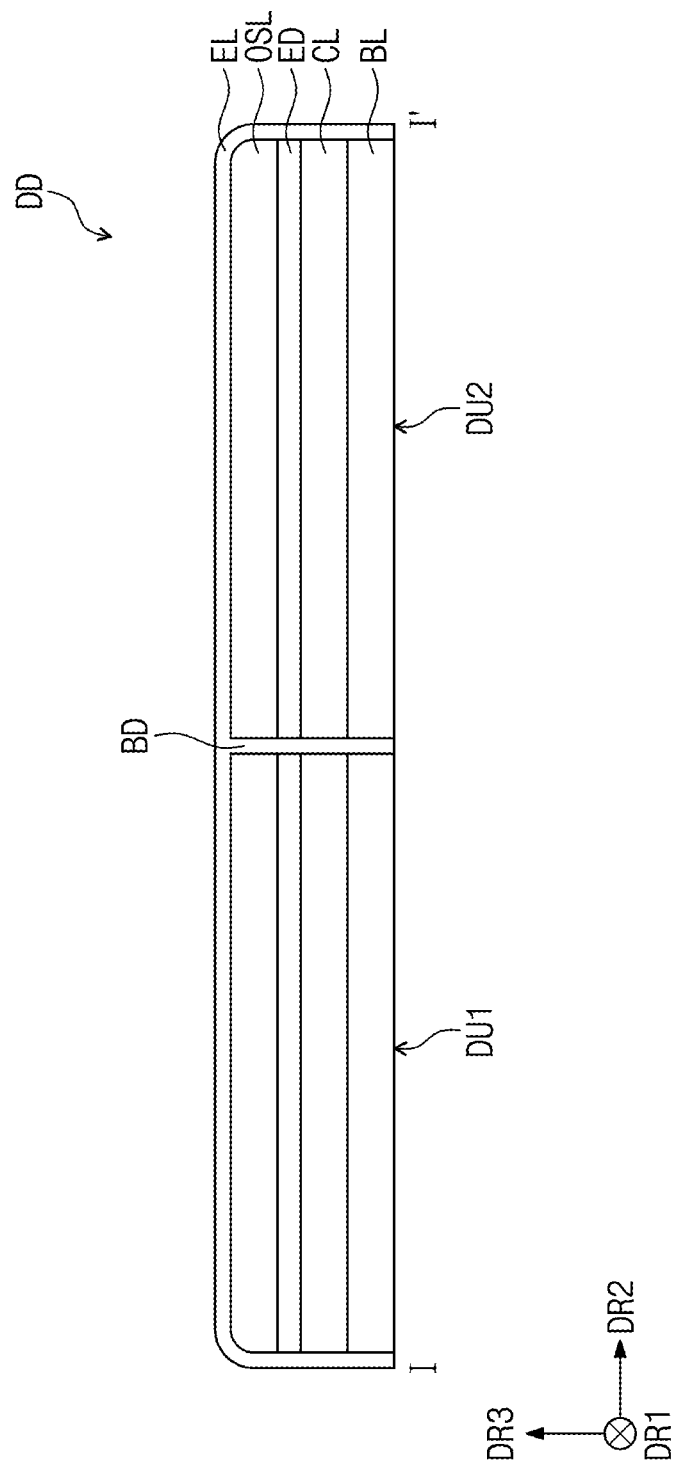
FIG. 5 is a cross-sectional view according to an embodiment, taken along line I-I' of FIG. 4A.
Figure 6A:
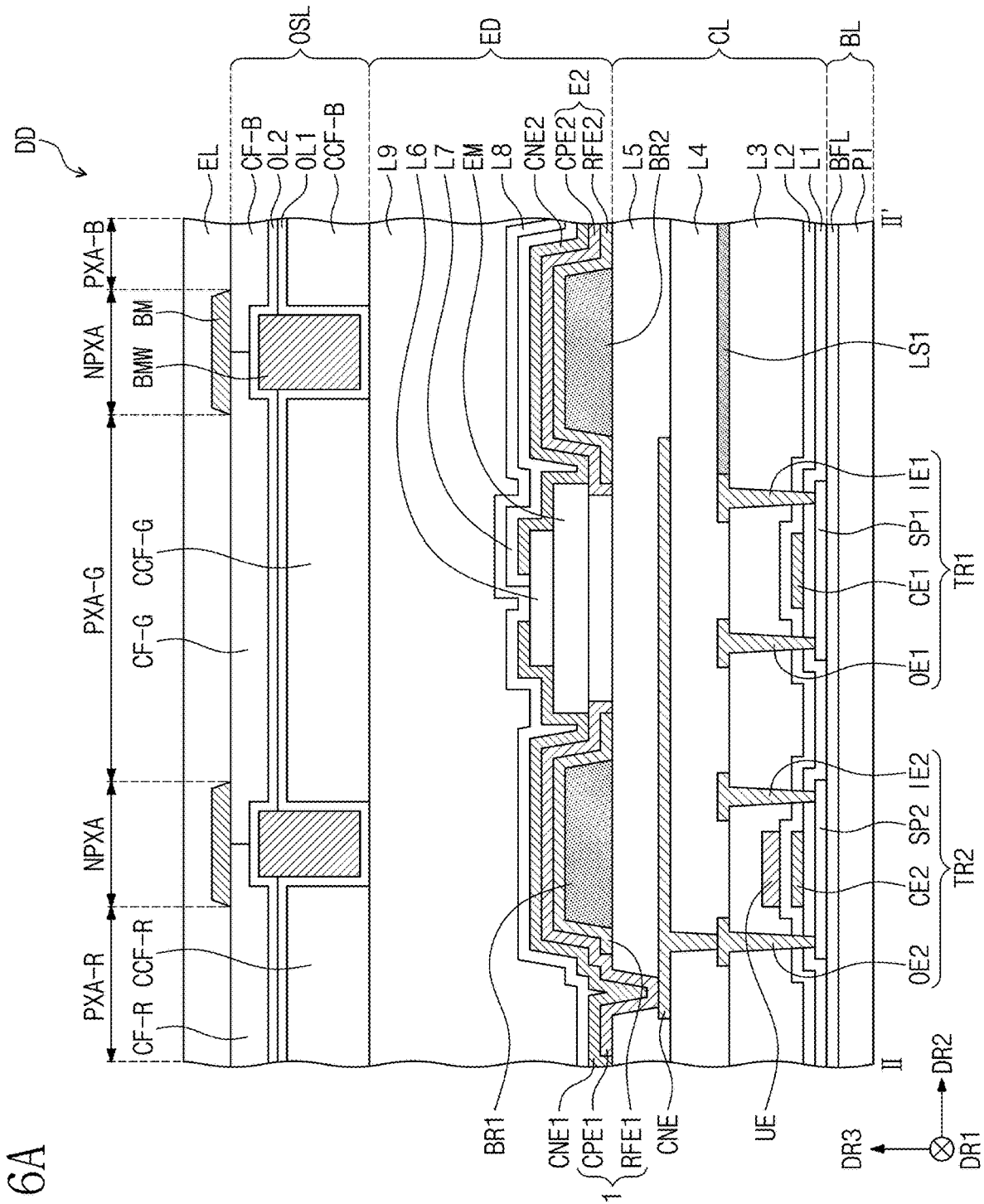
FIG. 6A is a cross-sectional view according to an embodiment, taken along line II-II' of FIG. 4A.
Figure 6B:
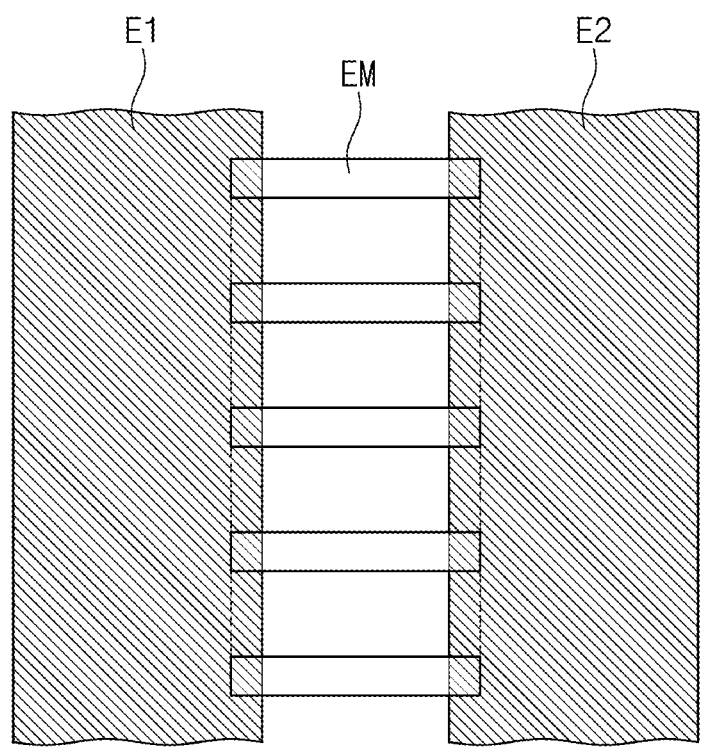
FIG. 6B is a plan view of the display panel illustrated in FIG. 6A.
Figure 6B:
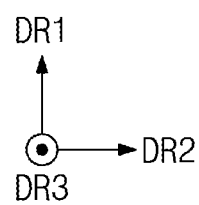

FIG. 4A is a plan view of a display panel according to an embodiment of the inventive concept. FIG. 4B is a rear view of a display panel according to an embodiment of the inventive concept. FIG. 5 is a cross-sectional view according to an embodiment, taken along line I-I' of FIG. 4A. FIG. 6A is a cross-sectional view according to an embodiment, taken along line II-II' of FIG. 4A. FIG. 6B is a plan view of the display panel illustrated in FIG. 6A.

Referring to FIG. 4A, the display panel DD according to an embodiment of the inventive concept may include a plurality of display units. For example, the display panel DD may include first to fourth display units DU1, DU2, DU3, and DU4 arranged in the first direction DR1 and the second direction DR2.

Each of the first to fourth display units DU1, DU2, DU3, and DU4 includes first to fourth active areas AA1, AA2, AA3, and AA4, and each of the first to fourth active areas AA1, AA2, AA3, and AA4 may combine together to form an active area (e.g., front surface IS) of the display panel DD.

Each of the first to fourth active areas AA1, AA2, AA3, and AA4 may provide different images or may combine together to provide a single image. In addition, adjacent active areas may combine together to provide a single image, and the invention is not limited to any one embodiment. The image may be provided as a still image as well as a dynamic image.

FIGS. 4A and 4B illustrate the first to fourth display units DU1, DU2, DU3, and DU4 arranged in the first direction DR1 and the second direction DR2 as an example, but the embodiment of the inventive concept is not limited thereto. In another embodiment, a display panel including a plurality of display units arranged in any one direction or formed of a single display unit may be provided. In addition, four or more display panels may be arranged and the invention not limited to any one embodiment.

Referring to FIG. 4B, the display panel DD according to an embodiment of the inventive concept may include a driving unit DB disposed on a rear surface US of each of the first to fourth display units DU1, DU2, DU3, and DU4. The driving unit DB may include a flexible circuit board FPCB bonded to a pad unit (not shown) exposed to the rear surface US of each of the first to fourth display units DU1, DU2, DU3, and DU4, a driving chip DC mounted on the flexible circuit board FPCB, and a main circuit board MPCB connected to the flexible circuit board FPCB.

The signal controller TC may be mounted on the main circuit board MPCB. The signal controller TC receives image data and control signals from an external graphic controller (not shown). The signal controller TC may provide control signals to the display panel DD.

The flexible circuit board FPCB may be connected to each of a pad unit (See FIG. 8) of the display panel DD and a pad unit (not shown) of the main circuit board MPCB through a conductive adhesive member. The conductive adhesive member may include an anisotropic conductive film ("ACF"). Hereinafter, the conductive adhesive member is described as an anisotropic conductive film (ACF).

The driving chip DC may be mounted on the flexible circuit board FPCB. Signals may be transmitted from the main circuit board MPCB to the driving chip DC, and the signals may be transmitted from the driving chip DC to the display panel DD. In the present embodiment, each driving chip DC may be a data driver DDV shown in FIG. 2. In an embodiment of the inventive concept, the flexible circuit board FPCB may transmit signals provided from the signal controller TC to the display panel DD.

In the present embodiment, the flexible circuit board FPCB and the main circuit board MPCB may be provided in plurality. For example, flexible circuit boards may be arranged to be spaced apart from each other in the second direction DR2, and one main circuit board MPCB may be connected to the four flexible circuit boards. Accordingly, two main circuit boards and four flexible circuit boards bonded to each main circuit board may be provided in the first to fourth display units DU1, DU2, DU3, and DU4.

FIG. 4B illustrates that the four flexible circuit boards FPCB are bonded to one main circuit board MPCB in each of the first to fourth display units DU1, DU2, DU3, and DU4, but the embodiment of the inventive concept is not limited to thereto, and the number and arrangement direction of the main circuit board MPCB and the flexible circuit board FPCB connected thereto are not limited to any one embodiment.

According to the inventive concept, when the width of a boundary BD between adjacent first to fourth active areas AA1, AA2, AA3, and AA4 is smaller, a display panel DD having improved viewability and aesthetics may be provided. That is, since the dead space (i.e., place where an image is not displayed) in the boundary BD is reduced, it is hard for a viewer to see the dead space between the display units. When the driving unit DB is connected to an end of the front surface IS, (e.g., active area) of each of the first to fourth display units DU1, DU2, DU3, and DU4 to be bent in a direction towards the rear surface US, the width of the boundary BD between the adjacent first to fourth active areas AA1, AA2, AA3, and AA4 increases, and thus may cause an issue that the boundary BD is viewed by a user.

In the display panel DD according to the inventive concept, the driving unit DB is disposed on the rear surface US of the display panel DD overlapping each of the first to fourth active areas AA1, AA2, AA3, and AA4, and thus a separate space for bonding the driving unit DB to the front surface IS (e.g., active area) of the display panel DD may be omitted. Accordingly, the width of the boundary BD between the adjacent first to fourth active areas AA1, AA2, AA3, and AA4 is reduced, thereby improving the issue that the boundary BD is viewed by a user, and thus a display panel DD having improved aesthetics may be provided.

Referring to FIG. 5, the display panel DD of the inventive concept may include a base layer BL, a circuit element layer CL, a display element layer ED, a light control layer OSL, and a cover layer EL. In the display panel DD according to the inventive concept, the circuit element layer CL, the display element layer ED, the light control layer OSL, and the cover layer EL disposed on the base layer BL may be formed through a continuous process without a separate bonding process. Accordingly, a dead space for bonding separate boards through a seal may be reduced.

The base layer BL may have a structure in which an organic insulating layer including an organic material and an inorganic insulating layer including an inorganic material are alternately stacked. Accordingly, the base layer BL may be flexible. However, the embodiment of the inventive concept is not limited thereto, and the base layer BL may be rigid or may be provided as a single layer, and the invention is not limited to any one embodiment.

In the circuit element layer CL, a driving circuit and driving elements for driving the pixels PX (See FIG. 2) may be disposed. In addition, the circuit element layer CL may include a plurality of insulating layers on which electrodes may be disposed.

The display element layer ED may be a layer for forming light and including a light emitting element. The display element layer ED may be electrically connected to the circuit element layer CL to receive signals.

The light control layer OSL may selectively convert a wavelength of light generated in the display element layer ED. The light control layer OSL may include a color control layer configured to control a wavelength of light and containing quantum dots.

The cover layer EL may be filled between the display units DU1 and DU2 which are spaced apart, and may seal the base layer BL, the circuit element layer CL, the display element layer ED, and the light control layer OSL included in each of the display units DU1 and DU2. The cover layer EL may include an organic material.

According to the inventive concept, the cover layer EL seals adjacent display units DU1 and DU2, and thus moisture and oxygen introduced from the outside may be blocked.

Referring to FIG. 6A, in the present embodiment, the display panel DD may include a base layer BL, a circuit element layer CL, a display element layer ED, a light control layer OSL, and a cover layer EL.

The base layer BL may include an organic insulating layer PI and an inorganic insulating layer BFL. A rear surface of the organic insulating layer PI may be defined as the rear surface US of the display panel DD.

The organic insulating layer PI may be a substrate including an organic material. For example, the organic material of the base substrate BS may include at least any one among polyimide, polyethylene naphthalate, polyethylene terephthalate, polyarylate, polycarbonate, polyetherimide, or polyethersulfone. Accordingly, the base substrate BS according to the inventive concept may be rigid or flexible, and the invention is not limited to any one embodiment.

The inorganic insulating layer BFL is disposed on the organic insulating layer PI. The inorganic insulating layer BFL may cover the organic insulating layer PI. The inorganic insulating layer BFL may be an insulating layer including an inorganic material. For example, the inorganic insulating layer BFL may include at least one among aluminum oxide, titanium oxide, silicon oxide, silicon nitride, silicon oxy nitride, silicon oxynitride, zirconium oxide, and hafnium oxide. The inorganic insulating layer BFL may be formed of or include multiple insulating layers. The inorganic insulating layer BFL may prevent foreign substances from being introduced from the outside.

The circuit element layer CL may include transistors TR1 and TR2, a plurality of insulating layers L1, L2, L3, L4, and L5, and a connection electrode CNE.

The first transistor TR1 may include a first control electrode CE1, a first input electrode IE1, a first output electrode OE1, and a first semiconductor pattern SP1. The second transistor TR2 may include a second control electrode CE2, a second input electrode 1E2, a second output electrode OE2, and a second semiconductor pattern SP2.

The first semiconductor pattern SP1 and the second semiconductor pattern SP2 may be disposed on the inorganic insulating layer BFL. The inorganic insulating layer BFL may provide a modified surface to the first semiconductor pattern SP1 and the second semiconductor pattern SP2. In this case, the first semiconductor pattern SP1 and the second semiconductor pattern SP2 may have higher adhesion to the inorganic insulating layer BFL than when directly disposed on the organic insulating layer PI. Alternatively, the inorganic insulating layer BFL may be a barrier layer protecting lower portions of each of the first semiconductor pattern SP1 and the second semiconductor pattern SP2. In this case, the inorganic insulating layer BFL may prevent the organic insulating layer PI itself, or contamination or moisture introduced through the organic insulating layer PI from penetrating into the first semiconductor pattern SP1 and the second semiconductor pattern SP2.

The first insulating layer Lmay be disposed on the inorganic insulating layer BFL and may cover the first semiconductor pattern SP1 and the second semiconductor pattern SP2. The first insulating layer L1 may include an inorganic material. The inorganic material may be, for example, silicon nitride, silicon oxynitride, silicon oxide, titanium oxide, or aluminum oxide, but the invention is not limited thereto.

The first control electrode CE1 and the second control electrode CE2 may be disposed on the first insulating layer L1. The second insulating layer L2 may be disposed on the first insulating layer L1 and may cover the first control electrode CE1 and the second control electrode CE2. The second insulating layer L2 may include an inorganic material.

An upper electrode UE may be disposed on the second insulating layer L2 and overlap the second control electrode CE2 in a plan view. The upper electrode UE may form a capacitor with the second control electrode CE2.

The third insulating layer L3 is disposed on the second insulating layer L2 and covers the upper electrode UE. The first input electrode IEL the first output electrode OE1, the second input electrode IE2, and the second output electrode OE2 may be disposed on the third insulating layer L3. In addition, a connection line LS1, which will be described later, may be disposed on the third insulating layer L3. The connection line LS1 may be branched from the first input electrode IE1.

The first input electrode IE1 and the first output electrode OE1 may be connected to the first semiconductor pattern SP1 through through-holes passing through the first to third insulating layers L1, L2, and L3. The second input electrode IE2 and the second output electrode OE2 may be connected to the second semiconductor pattern SP2 through throughholes passing through the first to third insulating layers L1, L2, and L3. On the third insulating layer L3, in addition to the first input electrode IEL the first output electrode OE1, the second input electrode 1E2, and the second output electrode OE2, signal wirings, for example, at least some of each of the scan lines or the data lines may be disposed.

The fourth insulating layer L4 may be disposed on the third insulating layer L3, and may cover the first input electrode IE1, the first output electrode OE1, the second input electrode 1E2, and the second output electrode OE2. The fourth insulating layer L4 may be a single layer or a plurality of layers, and the fourth insulating layer L4 may include an organic material and/or an inorganic material. The fourth insulating layer L4 may be a planarization layer which provides a planar surface on which the fifth insulating layer L5 is disposed.

A connection electrode CNE may be disposed on the fourth insulating layer L4. On the fourth insulating layer L4, in addition to the connection electrode CNE, signal wirings, for example, at least some other of each of the scan lines or the data lines may be disposed. The connection electrode CNE may be connected to the second output electrode OE2.

The fifth insulating layer L5 may be disposed on the fourth insulating layer L4, and may cover the connection electrode CNE. The fifth insulating layer L5 may include an organic material. The fifth insulating layer L5 may cover components disposed below the fifth insulating layer L5, and provide a planar surface on which the display element layer ED may be formed.

The light emitting element EM included in the display element layer ED according to the present embodiment may be a light emitting element EM including a nano light emitting diode (LED).

The display element layer ED may include a plurality of partition walls BR1 and BR2, a plurality of electrodes E1, E2, CNE1, and CNE2, and a plurality of insulating layers L6, L7, L8, and L9.

A first partition wall BR1 and a second partition wall BR2 may be disposed on the fifth insulating layer L5. Each of the first partition wall BR1 and the second partition wall and BR2 may extend in the first direction DR1. The second partition wall BR2 may be spaced apart from the first partition wall BR1 along the second direction DR2. The first partition wall BR1 and the second partition wall BR2 may include the same material. For example, the first partition wall BR1 and the second partition wall BR2 may include an organic material.

The first electrode E1 may be disposed on the first partition wall BR1, and the second electrode E2 may be disposed on the second partition wall BR2. The first electrode E1 may extend in the first direction DR1 and cover the first partition wall BR1, and the second electrode E2 may extend in the first direction DR1 and cover the second partition wall BR2. That is, the first partition wall BR1 may be disposed between the first electrode E1 and the fifth insulating layer L5, and the second partition wall BR2 may be disposed between the second electrode E2 and the fifth insulating layer L5.

A through-hole may be provided in the fifth insulating layer L5, and the connection electrode CNE may be exposed through the through-hole. The first electrode E1 may be electrically connected to the exposed connection electrode CNE. Although not shown, the second electrode E2 may be electrically connected to a power line. That is, the second power voltage ELVSS (see FIG. 2) may be provided in the second electrode E2.

The first electrode E1 may include a first reflective electrode RFE1 and a first capping electrode CPE1, and the second electrode E2 may include a second reflective electrode RFE2 and a second capping electrode CPE2.

The first reflective electrode RFE1 and the second reflective electrode RFE2 each may include a reflective material. The first reflective electrode RFE1 and the second reflective electrode RFE2 each may have a single layer structure or a plurality of stack structures. For example, the first reflective electrode RFE1 and the second reflective electrode RFE2 each may have a structure in which indium tin oxide, silver (Ag), and indium tin oxide are sequentially stacked.

The first capping electrode CPE1 may cap the first reflective electrode RFE1, and the second capping electrode CPE2 may cap the second reflective electrode RFE2. For example, the first capping electrode CPE1 and the second capping electrode CPE2 each may include at least one among indium zinc oxide, indium tin oxide, indium gallium oxide, indium zinc gallium oxide, and a mixture/compound thereof.

The light emitting element EM may be disposed on the fifth insulating layer L5. The light emitting element EM may be provided in plurality. For example, as shown in FIG. 6B, each light emitting element provided in plurality may extend in the second direction DR2 and be arranged to be spaced apart along the first direction DR1. The light emitting element EM may be electrically connected to the first electrode E1 and the second electrode E2. One end of light emitting element EM may be connected to the first electrode E1, and the other end of each light emitting element may be connected to the second electrode E2. The light emitting element EM may be provided in plurality.

FIG. 6B illustrates, as an example, that one end of the light emitting element EM is disposed on the first electrode E1 and the other end of the light emitting element EM is disposed on the second electrode E2. However, the embodiment of the inventive concept is not limited thereto. For example, the light emitting element EM may be disposed between the first electrode E1 and the second electrode E2. For example, the length of the light emitting element EM may be shorter than the distance between the first electrode E1 and the second electrode E2. In addition, the light emitting element EM may not overlap the first electrode E1 and the second electrode E2 in a plan view.

A sixth insulating layer L6 may be disposed on the light emitting element EM. The sixth insulating layer L6 may cover at least a portion of an upper surface of the light emitting element EM.

The light emitting element EM may be electrically connected to the first electrode E1 through the first connection electrode CNE1, be electrically connected to the second electrode E2 through the second connection electrode CNE2.

The second connection electrode CNE2 may be disposed on the light emitting element EM and the second electrode E2. A seventh insulating layer L7 may be disposed on the second connection electrode CNE2. The first connection electrode CNE1 may be disposed on the light emitting element EM and the first electrode E1. The second connection electrode CNE2 and the first connection electrode CNE1 may not be in direct contact with each other by the seventh insulating layer L7.

The first connection electrode CNE1 and the second connection electrode CNE2 may include a conductive material. For example, the conductive material may include at least any one among indium zinc oxide, indium tin oxide, indium gallium oxide, indium zinc gallium oxide, and a mixture/compound thereof. However, the embodiment of the inventive concept is not limited thereto. In another embodiment, for example, the conductive material may be a metal material, and the metal material may include, for example, molybdenum, silver, titanium, copper, aluminum, or an alloy thereof.

An eighth insulating layer L8 may be disposed on the first connection electrode CNE1 and the seventh insulating layer L7. The eighth insulating layer L8 may be an encapsulation layer.

A ninth insulating layer L9 may be disposed on the eighth insulating layer L8. The ninth insulating layer L9 covers components disposed below the ninth insulating layer L9 and provides a planar surface on which the light control layer OSL may be formed.

The light control layer OSL may be directly disposed on the display element layer ED. The light control layer OSL includes color control layers CCF-R, CCF-G, and CCF-B, a plurality of insulating layers OL1 and OL2, a dividing partition wall BMW, color filter layers CF-R, CF-G, and CF-B, and a dividing pattern BM.

The first to third color control layers CCF-R, CCF-G, and CCF-B may be disposed on the display element layer ED to correspond to first to third pixel areas PXA-R, PXA-G, and PXA-B, respectively. The first to third color control layers CCF-R, CCF-G, and CCF-B may absorb source light generated in the light emitting element EM and generate light of different colors. The first to third color control layers CCF-R, CCF-G, and CCF-B may transmit and scatter some of the incident source light.

In an embodiment, for example, the first color control layer CCF-R absorbs blue light to generate red light, and the second color control layer CCF-G absorbs blue light to generate green light. That is, the first color control layer CCF-R and the second color control layer CCF-G may include different quantum dots. The third color control layer CCF-B may transmit blue light.

The first and second color control layers CCF-R and CCF-G may include a base resin and quantum dots mixed (or dispersed) in the base resin.

The base resin is a medium in which quantum dots are dispersed, and may be formed of various resin compositions, which may be generally referred to as a binder. However, the embodiment of the inventive concept is not limited thereto, and as long as the medium is capable of dispersing quantum dots, the medium may be referred to as a base resin regardless of names, additional functions, constituent materials, etc. The base resin may be a polymer resin. For example, the base resin may be an acrylic-based resin, a urethane-based resin, a silicone-based resin, an epoxy-based resin, etc. The base resin may be a transparent resin.

Quantum dots may be particles converting a wavelength of incident light. Quantum dots have a crystalline structure of a few nanometers in size, contain hundreds to thousands of atoms, and exhibit a quantum confinement effect in which an energy band gap is increased due to the small size thereof. When light of a wavelength having higher energy than the band gap is incident on quantum dots, the quantum dots absorb the light to be excited, and fall to a ground state while emitting light of a specific wavelength. The emitted light of the specific wavelength has a value corresponding to the band gap. When the quantum dots are adjusted in size and composition, light emitting properties due to the quantum confinement effect may be controlled.

Quantum dots may be selected from a Group II-VI compound, a Group III-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group compound may be selected from a ternary compound selected from the group consisting of $AgInS_2$, $CuInS_2$, $AgGaS_2$, $CuGaS_2$, or a mixture thereof, or a quaternary compound such as $AgInGaS_2$ and $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal. For example, InZnP, etc. may be selected as the III-II-V group compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV compound may be a binary compound selected from the group consisting of SiC, SiGe, and a mixture thereof.

In this case, a binary compound, a ternary compound, or a quaternary compound may be present in particles in a uniform concentration distribution, or may be present in the same particle in a partially different concentration distribution. In addition, a core/shell structure in which one quantum dot surrounds other quantum dots may be present. An interface between a core and a shell may have a concentration gradient in which the concentration of an element present in the shell becomes lower towards the center.

According to an embodiment, quantum dots may have a core/shell structure including a core having nano-crystals, and a shell surrounding the core, which are described above. The shell of the quantum dots may serve as a protection layer to prevent the chemical deformation of the core so as to keep semiconductor properties, and/or a charging layer to impart electrophoresis properties to the quantum dots. The shell may be a single layer or multiple layers. An interface between the core and the shell may have a concentration gradient in which the concentration of an element present in the shell becomes lower towards the center. An example of the shell of the quantum dots may be a metal or non-metal oxide, a semiconductor compound, or a combination thereof.

In an embodiment, for example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but the embodiment of the inventive concept is not limited thereto.

In addition, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiment of the inventive concept is not limited thereto.

Quantum dots may have a full width of half maximum ("FWHM") of a light emission wavelength spectrum of about 45 nanometers (nm) or less, preferably about 40 nm or less, more preferably about 30 nm or less, and color purity or color reproducibility may be enhanced in the above range. In addition, light emitted through such quantum dots is emitted in all directions, and thus a wide viewing angle may be improved.

In addition, the form of quantum dots is not particularly limited as long as the quantum dots are in the form commonly used in the art, but more specifically, quantum dots in the form of spherical, pyramidal, multi-arm, or cubic nanoparticles, nanotubes, nanowires, nanofibers, nanoparticles, etc. may be used. Quantum dots may control the color of emitted light according to particle sizes, and thus the quantum dots may have various light emission colors such as red, green, blue light, etc.

Quantum dots may control the color of emitted light according to particle sizes, and thus the quantum dots may have various light emission colors such as blue, red, green, etc.

In the present embodiment, the third color control layer CCF-B transmitting blue light may further include scattering particles (i.e., scattering bodies). The scattering particles may be titanium oxide or silica-based nanoparticles.

The first insulating layer OL1 may be deposited on the entirety of the display element layer ED to cover the first to third color control layers CCF-R, CCF-G, and CCF-B. The first insulating layer OL1 covers the first to third color control layers CCF-R and CCF-G, and CCF-B in an area overlapping the first to third pixel areas PXA-R, PXA-G, and PXA-B, overlaps the display element layer ED in an area overlapping the peripheral area NPXA in a plan view, and may thus individually seal the first to third color control layers CCF-R, CCF-G, and CCF-B.

The first insulating layer OL1 may include an inorganic material. For example, the first insulating layer OL1 may include any one among silicon oxide, silicon nitride, or silicon oxy nitride.

The dividing partition wall BMW may be disposed on the first insulating layer OL1 and overlap the peripheral area NPXA on the first insulating layer OL1 in a plan view. A portion of the dividing partition wall BMW may be covered by the first insulating layer OL1 and the remaining portion of the dividing partition wall BMW may be covered by the second insulating layer OL2. The dividing partition wall BMW may include a black coloring agent. The dividing partition wall BMW may prevent light provided from the light emitting element EM from penetrating into adjacent pixel areas PXA-R, PXA-G, and PXA-B.

The second insulating layer OL2 may be deposited on the entirely of the first insulating layer OL1 and the dividing partition wall BMW to cover the first insulating layer OL1 and the dividing partition wall BMW. The second insulating layer OL2 may be in contact with the first insulating layer OL1 in an area overlapping the first to third color control layers CCF-R, CCF-G, and CCF-B, and be in contact with the dividing partition wall BMW in other areas.

The second insulating layer OL2 may include an inorganic material. For example, the first insulating layer OL1 may include any one among silicon oxide, silicon nitride, or silicon oxy nitride.

The first to third color filter layers CF-R, CF-G, and CF-B are disposed on the second insulating layer OL2. The color filter layers CF-R, CF-G, and CF-B may be disposed to overlap the first to third pixel areas PXA-R, PXA-G, and PXA-B, respectively. The first to third color filter layers CF-R, CF-G, and CF-B include pigments and/or dyes absorbing different wavelength ranges. The first color filter layer CF-R may be a red color filter, the second color filter layer CF-G may be a green color filter, and the third color filter layer CF-B may be a blue color filter.

The dividing pattern BM is disposed on the first to third color filter layers CF-R, CF-G, and CF-B and overlaps the peripheral area NPXA. The dividing pattern BM may include a black coloring agent. The black coloring agent may include a black dye and a black pigment. The black coloring agent may include carbon black, a metal such as chromium, or an oxide thereof.

The cover layer EL may cover the light control layer OSL. The cover layer EL may include an organic material.

Figure 7:
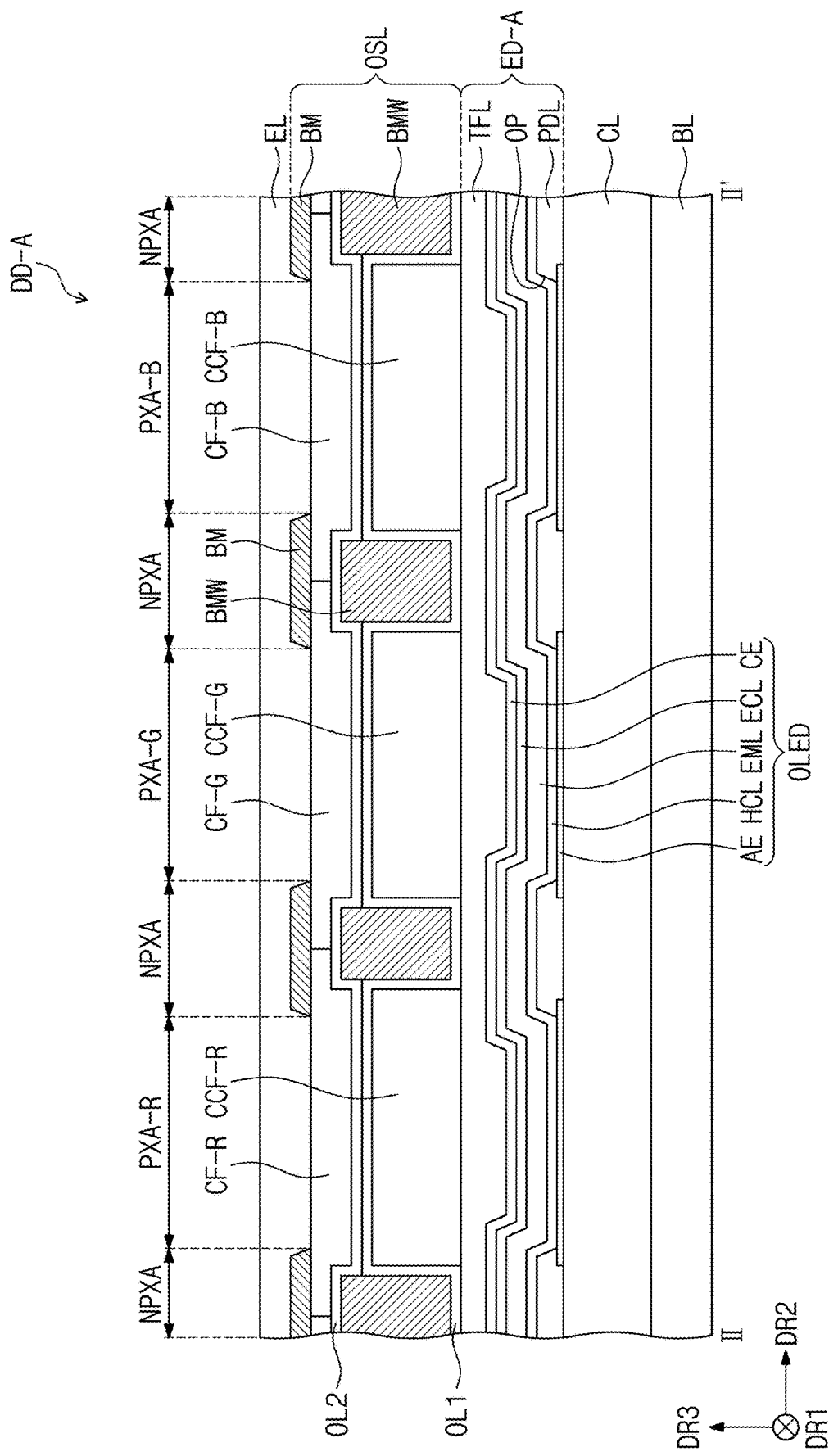
FIG. 7 is a cross-sectional view according to another embodiment, taken along line II-II' of FIG. 4A.

FIG. 7 is a cross-sectional view according to another embodiment, taken along line II-IP of FIG. 4A.

Referring to FIG. 7, a display panel DD-A according to the present embodiment may include a base layer BL, a circuit element layer CL, a display element layer ED-A, a light control layer OSL, and a cover layer EL. The base layer BL, the circuit element layer CL, the light control layer OSL, and the cover layer EL shown in FIG. 7 may be the same in configuration as the base layer BL, the circuit element layer CL, the light control layer OSL, and the cover layer EL described in FIG. 6A, and duplicate descriptions are omitted.

In the present embodiment, the display element layer ED-A includes a light emitting element OLED and an encapsulation layer TFL. The light emitting element OLED may generate the source light described above. The light emitting element OLED includes a first electrode, a second electrode, and an emission layer EML disposed therebetween. In the present embodiment, the display element layer ED-A may include an organic light emitting diode as a light emitting element. The display element layer ED-A includes a pixel defining film PDL. For example, the pixel defining film PDL may include an organic material.

A first electrode AE is disposed on the circuit element layer CL. The first electrode AE may be directly or indirectly connected to a transistor of the circuit element layer CL. A display opening OP is defined in the pixel defining film PDL. The display opening OP of the pixel defining film PDL exposes at least a portion of the first electrode AE.

A hole control layer HCL, an emission layer EML, and an electron control layer ECL may be commonly disposed in the first to third pixel areas PXA-R, PXA-G, and PXA-B and the peripheral area NPXA.

The hole control layer HCL may include a hole transport layer, and may further include a hole injection layer. The emission layer EML may generate blue light. Blue light may include a wavelength of about 410 nm to about 480 nm. The emission spectrum of blue light may have a maximum peak in about 440 nm to about 460 nm. The electron control layer ECL may include an electron transport layer and may further include an electron injection layer. The emission layer EML may be commonly disposed in all areas of the first to third pixel areas PXA-R, PXA-G, and PXA-B, or be patterned to be independently arranged in each of the corresponding first to third pixel areas PXA-R, PXA-G, and PXA-B.

The encapsulation layer TFL may be disposed on the second electrode CE. The encapsulation layer TFL may cover the second electrode CE to protect the second electrode CE. The encapsulation layer TFL may include an organic material or an inorganic material. The encapsulation layer TFL may have a multilayer structure in which an inorganic layer/organic layer is alternately placed. The encapsulation layer TFL may have a sealing structure of an inorganic layer/organic layer/inorganic layer. The encapsulation layer TFL may further include a refractive index control layer to improve light emission efficiency.

Figure 8:
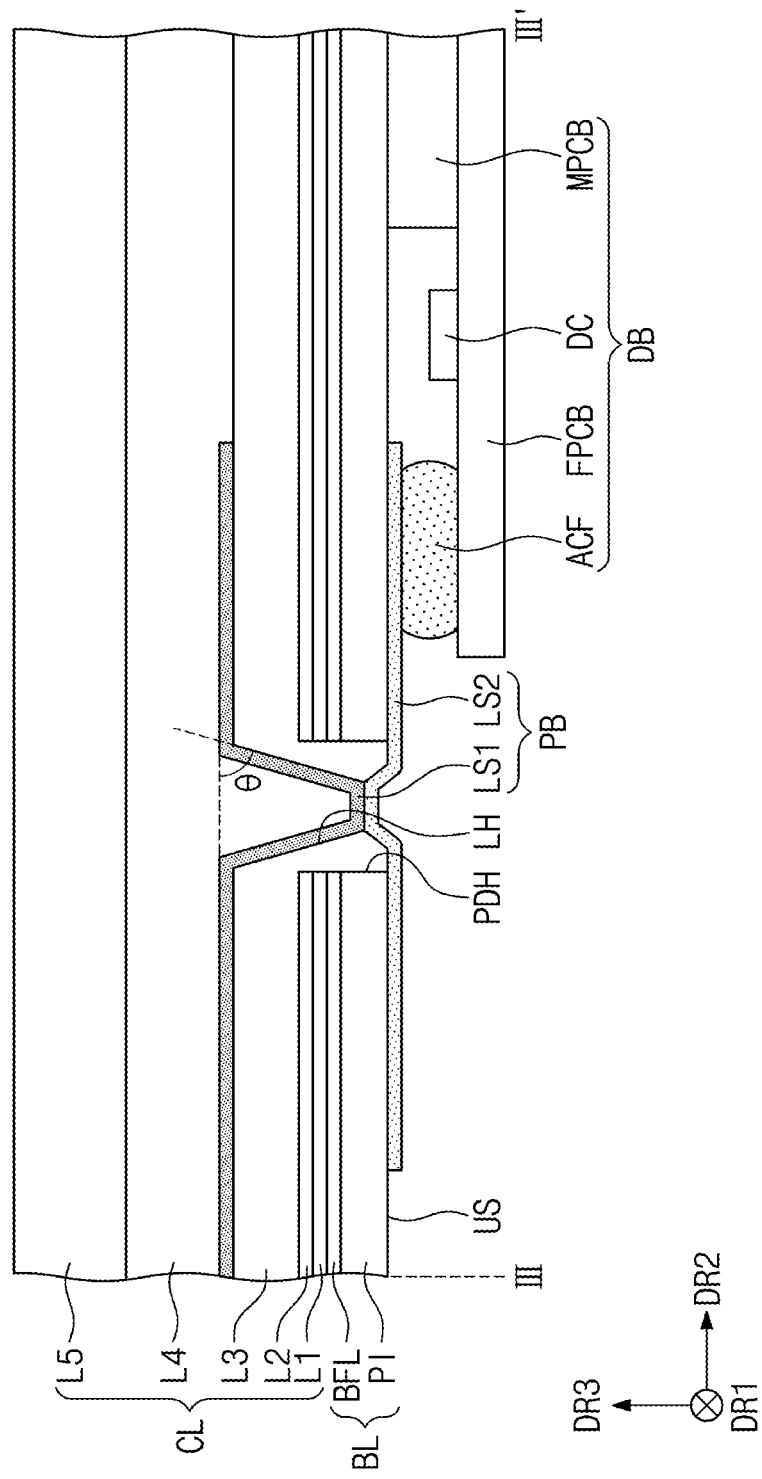
FIG. 8 is a cross-sectional view according to an embodiment, taken along line III-III' of FIG. 4B.
Figure 9:
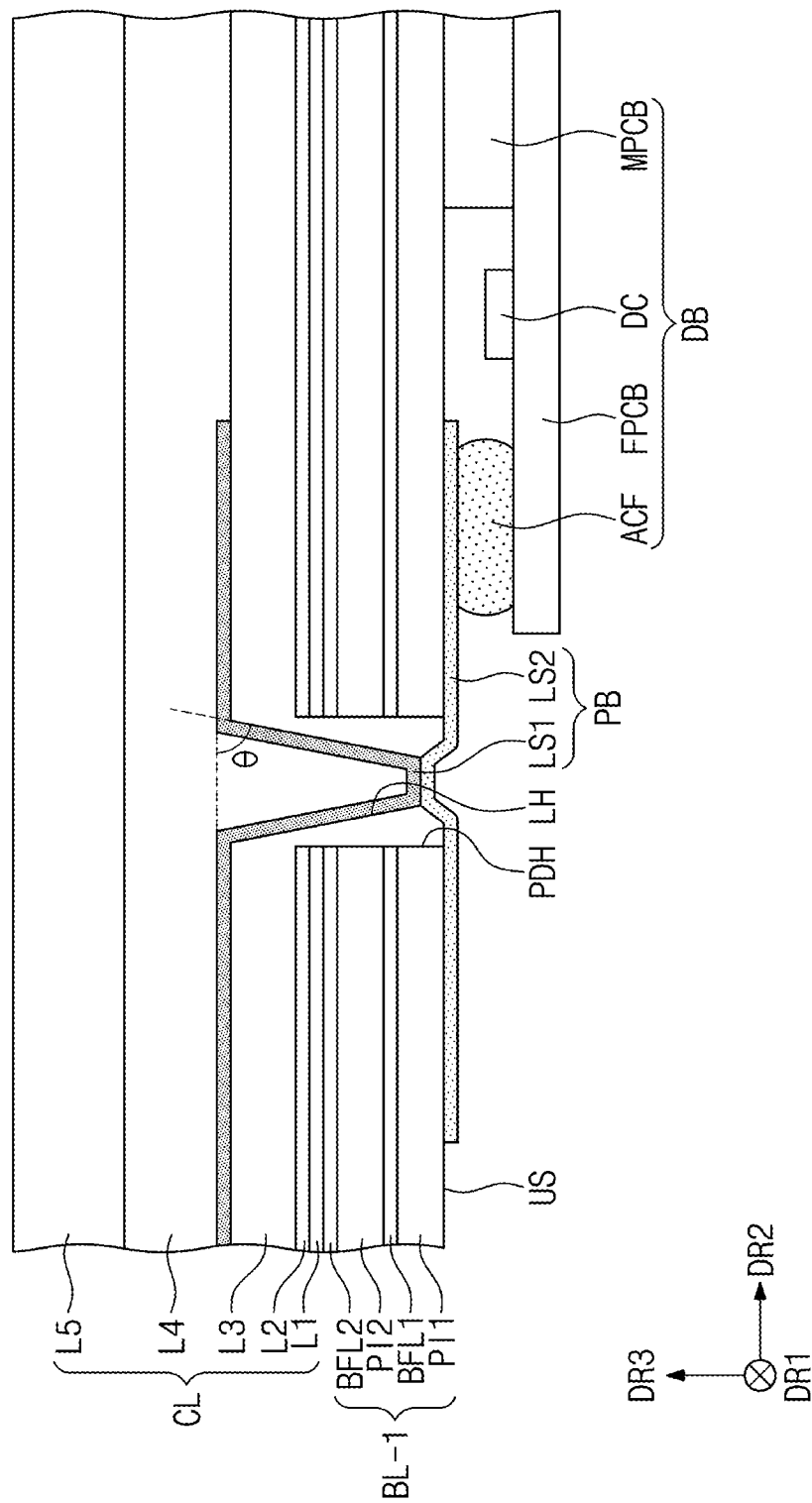
FIG. 9 is a cross-sectional view of a display panel according to another embodiment of the inventive concept.
Figure 10:
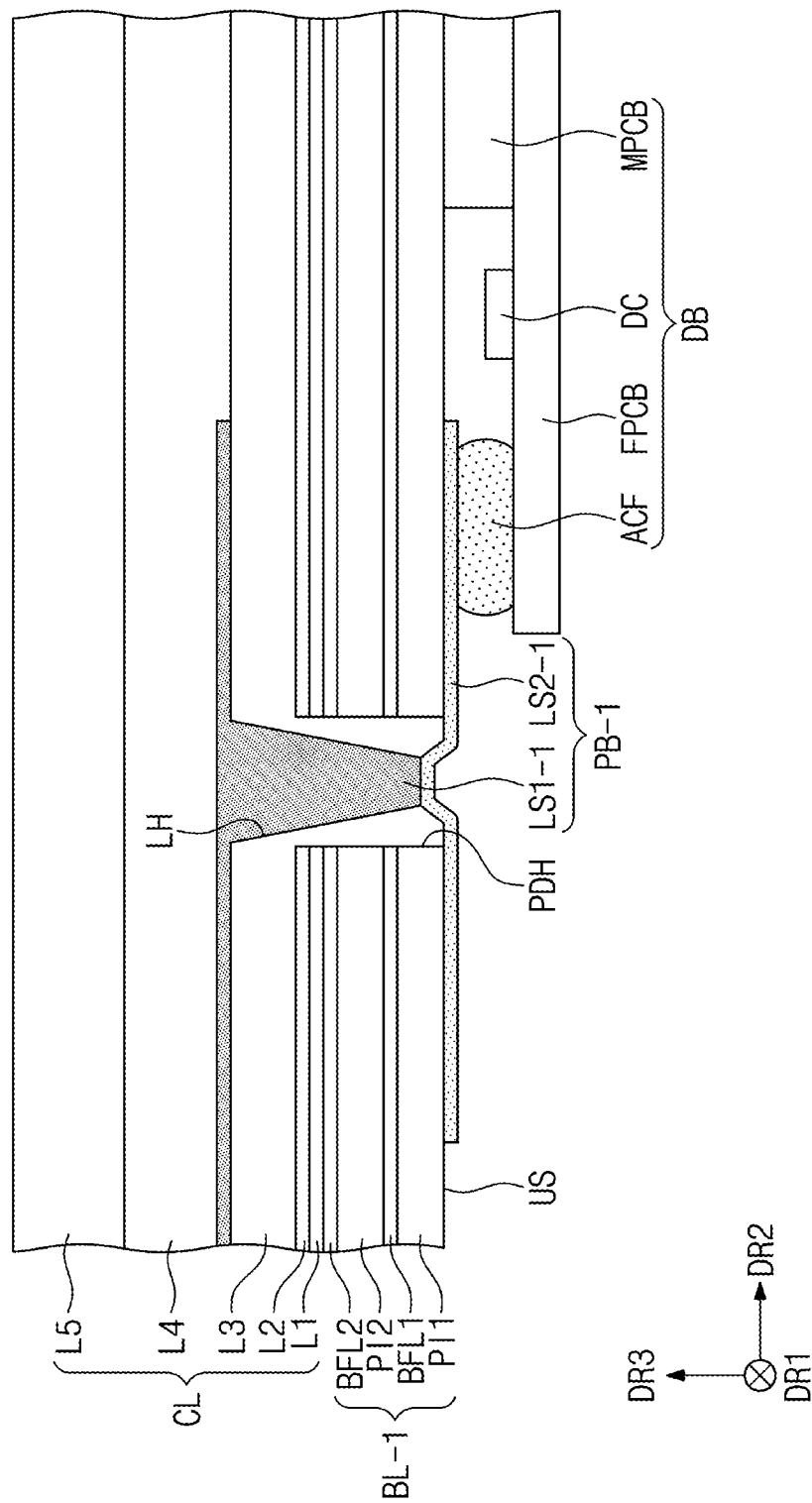
FIG. 10 is a cross-sectional view of a display panel according to still another embodiment of the inventive concept.

FIG. 8 is a cross-sectional view according to an embodiment, taken along line of FIG. 4B. FIG. 9 is a cross-sectional view of a display panel according to another embodiment of the inventive concept. FIG. 10 is a cross-sectional view of a display panel according to still another embodiment of the inventive concept. FIGS. 9 and 10 are cross-sectional views according to an embodiment in which the same area as the cross-sectional view shown in FIG. 8 is taken. That is, FIGS. 8 and 9 are cross-sectional views according to other embodiments, taken along line of FIG. 4B. For the same/like configurations as ones in FIGS. 1 to 7, the same/like reference numerals are given and duplicate descriptions are omitted.

A pad hole PDH may be defined in the display panel DD according to the inventive concept. The pad hole PDH may be formed to pass through the insulating layers L1 and L2 and the base layer BL. The first insulating layer L1 may be an insulating layer covering the semiconductor patterns SP1 and SP2 in FIG. 6A, and the second insulating layer L2 may be an insulating layer covering the control electrodes CE1 and CE2. However, the insulating layers forming the pad hole PDH are not limited thereto, and may be variously altered according to structures of a transistor included in the circuit element layer CL, and are not limited to any one embodiment.

The pad hole PDH may be defined by a side surface of the organic insulating layer PI, a side surface of the inorganic insulating layer BFL, a side surface of the first insulating layer L1, and a side surface of the second insulating layer L2. The respective side surfaces may be aligned with each other.

The pad hole PDH may be covered by the third insulating layer L3. The third insulating layer L3 may include an organic material. Accordingly, the side surface of the organic insulating layer PI, the side surface of the inorganic insulating layer BFL, the side surface of the first insulating layer L1, and the side surface of the second insulating layer L2 are covered by the third insulating layer L3 to be in contact with the third insulating layer L3.

The third insulating layer L3 may overlap the pad hole PDH and define an insulating hole LH surrounded by the pad hole PDH. The maximum width of the insulating hole LH in the second direction DR2 inside the pad hole PDH is smaller than the width of the pad hole PDH in the second direction DR2.

An angle θ between a virtual line (indicated by a dotted line) parallel to an upper surface of the third insulating layer L3 and a side inclined surface of the third insulating layer L3 defining the insulating hole LH may be about 50° to about 80°.

When the angle θ is less than 50°, the width of the insulating hole LH in a direction parallel to the plane defined by the first direction DR1 and the second direction DR2 unnecessarily increases. When the angle θ is greater than 80°, the connection line LS1 may be disconnected at a corner portion where the upper surface of the third insulating layer L3 and the side surface of the third insulating layer L3 defining the insulating hole LH are in contact.

The driving unit DB according to the inventive concept may be connected to the pad unit PB exposed to the rear surface US (see FIG. 4B) of the display panel DD through an anisotropic conductive film (ACF).

The pad unit PB may include a connection line LS1 and a pad line LS2. The connection line LS1 may be disposed on the third insulating layer L3. The connection line LS1 may be a line connected to transistors TR1 and TR2. For example, referring to FIG. 6A, the connection line LS1 may be branched from the first input electrode IE1 of the first transistor TR1. However, this is presented as an example, and the connection line LS1 may be branched from any one of the electrodes included in the transistors TR1 and TR2.

In the present embodiment, the connection line LS1 may extend along the shape of the insulating hole LH. A portion of the connection line LS1 may extend along the upper surface of the third insulating layer L3, and the remaining portion of the connection line LS1 may extend along a side surface of the third insulating layer L3 forming the insulating hole LH.

The fourth insulating layer L4 is disposed on the third insulating layer L3. The fourth insulating layer L4 may fill a space on the connection line LS1 extending along the shape of the insulating hole LH and inside the insulating hole LH. The fifth insulating layer L5 may be disposed on the fourth insulating layer L4.

The pad line LS2 may be disposed on the rear surface US of the display panel DD (see FIG. 4B). The rear surface US of the display panel DD (see FIG. 4B) may be provided as the rear surface of the organic insulating layer PI included in the base layer BL.

A portion of the pad line LS2 may extend along the rear surface US, and the remaining portion of the pad line LS2 may extend along the side surface of the third insulating layer L3 forming the insulating hole LH. A portion of the pad line LS2 disposed on the rear surface US may be connected to the flexible circuit board FPCB of the driving unit DB through an anisotropic conductive film ACF. The connection line LS1 and the pad line LS2 may be in contact inside the insulating hole LH.

According to the inventive concept, the pad unit PB is disposed in the insulating hole LH defined to pass through at least any one of the insulating layers (e.g., the organic insulating layer PI, the inorganic insulating layer BFL, and the first to third insulating layers L1 to L3) included in the base layer BL and the circuit element layer CL, and connected to the driving unit DB on the rear surface US, thereby reducing a separate space for disposing the driving unit DB. Accordingly, in the display panel DD in which the plurality of display units (see FIGS. 4A and 4B) are arranged, the width of the boundary BD (see FIGS. 4A and 4B) between adjacent display units may be reduced. Thus, the display panel DD having improved aesthetics may be provided. That is, since the dead space (i.e., place where an image is not displayed) in the boundary BD is reduced, it is hard for a viewer to see the dead space between the display units.

Referring to FIG. 9, in the present embodiment, a base layer BL-1 may include a first organic insulating layer PI1, a first inorganic insulating layer BFL1, a second organic insulating layer PI2, and a second inorganic insulating layer BFL2, which are sequentially stacked along the third direction DR3.

In the present embodiment, the pad hole PDH may be defined to pass through the insulating layers L1 and L2 and the base layer BL-1.

The pad hole PDH may be defined by a side surface of the first organic insulating layer PI1, a side surface of the first inorganic insulating layer BFL1, a side surface of the second organic insulating layer PI2, a side surface of the second inorganic insulating layer BFL2, a side surface of the first insulating layer L1, and a side surface of the second insulating layer L2. The respective side surfaces may be aligned with each other.

The pad hole PDH may be covered by the third insulating layer L3. The third insulating layer L3 may include an organic material. Accordingly, the side surface of the first organic insulating layer PI1, the side surface of the first inorganic insulating layer BFL1, the side surface of the second organic insulating layer PI2, the side surface of the second inorganic insulating layer BFL2, the side surface of the first insulating layer L1, and the side surface of the second insulating layer L2 are covered by the third insulating layer L3 to be in contact with the third insulating layer L3.

The third insulating layer L3 may overlap the pad hole PDH and define an insulating hole LH surrounding the pad hole PDH. The maximum width of the insulating hole LH in the second direction DR2 inside the pad hole PDH is smaller than the width of the pad hole PDH in the second direction DR2.

An angle θ from a virtual line (indicated by a dotted line) parallel to an upper surface of the third insulating layer L3 to a side surface of the third insulating layer L3 defining the insulating hole LH may be about 50° to about 80°.

The driving unit DB according to the inventive concept may be connected to the pad unit PB exposed to the rear surface US (see FIG. 4B) of the display panel DD through an anisotropic conductive film (ACF).

The pad unit PB may include a connection line LS1 and a pad line LS2. The connection line LS1 may be disposed on the third insulating layer L3. The connection line LS1 may be branched from any one of the electrodes included in the transistors TR1 and TR2 shown in FIG. 6A. Accordingly, the connection line LS1 may be a line connected to the transistors TR1 and TR2.

In the present embodiment, the connection line LS1 may extend along the shape of the insulating hole LH. A portion of the connection line LS1 may extend along the upper surface of the third insulating layer L3, and the remaining portion of the connection line LS1 may extend along the side surface of the third insulating layer L3 forming the insulating hole LH.

The fourth insulating layer L4 is disposed on the third insulating layer L3. The fourth insulating layer L4 may fill a space on the connection line LS1 extending along the shape of the insulating hole LH and inside the insulating hole LH. The fifth insulating layer L5 may be disposed on the fourth insulating layer L4.

The pad line LS2 may be disposed on the rear surface US of the display panel DD (see FIG. 4B). The rear surface US of the display panel DD (see FIG. 4B) may be provided as the rear surface of the organic insulating layer PI included in the base layer BL.

A portion of the pad line LS2 may extend along the rear surface US, and the remaining portion of the pad line LS2 may extend along the side surface of the third insulating layer L3 forming the insulating hole LH. A portion of the pad line LS2 disposed on the rear surface US may be connected to the flexible circuit board FPCB of the driving unit DB through an anisotropic conductive film ACF. The connection line LS1 and the pad line LS2 may be in contact inside the insulating hole LH.

Referring to FIG. 10, the present embodiment solely describes the differences from the embodiment described in FIG. 9, and duplicate descriptions are omitted.

In the present embodiment in FIG. 10, a pad unit PB-1 includes a connection line LS1-1 and a pad line LS2-1. Unlike the connection line LS1 shown in FIG. 9, the connection line LS1-1 may be filled inside the insulating hole LH.

The pad line LS2-1 may be disposed on the rear surface US of the display panel DD (see FIG. 4B). The rear surface US of the display panel DD (see FIG. 4B) may be provided as the rear surface of the first organic insulating layer PI1 included in the base layer BL-1. The connection line LS1-1 and the pad line LS2-1 may be in contact inside the insulating hole LH.

Figure 11A:
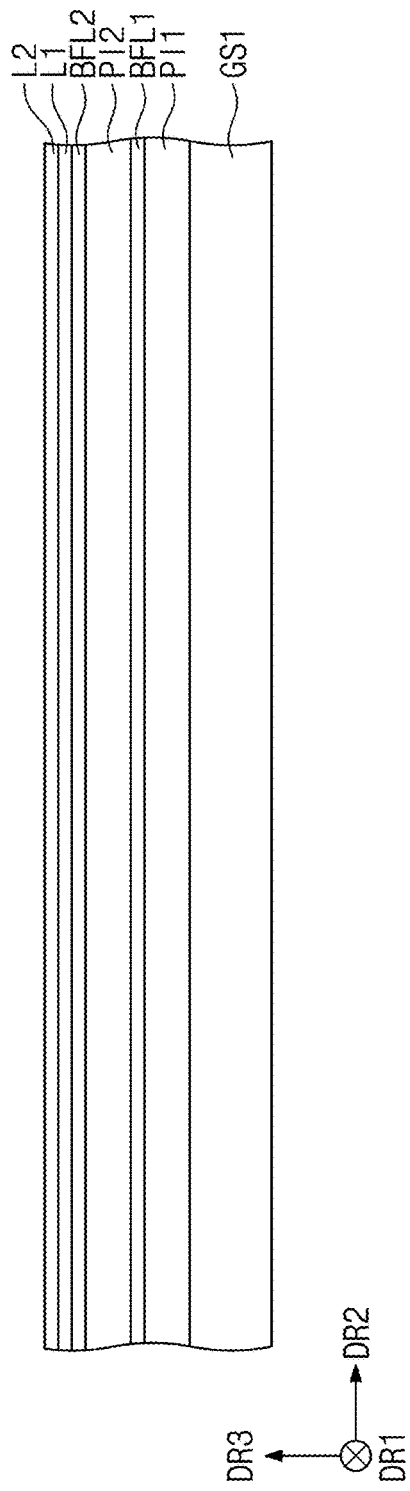
FIG. 11A is a cross-sectional view of a method for manufacturing a display panel according to an embodiment of the inventive concept.
Figure 11B:
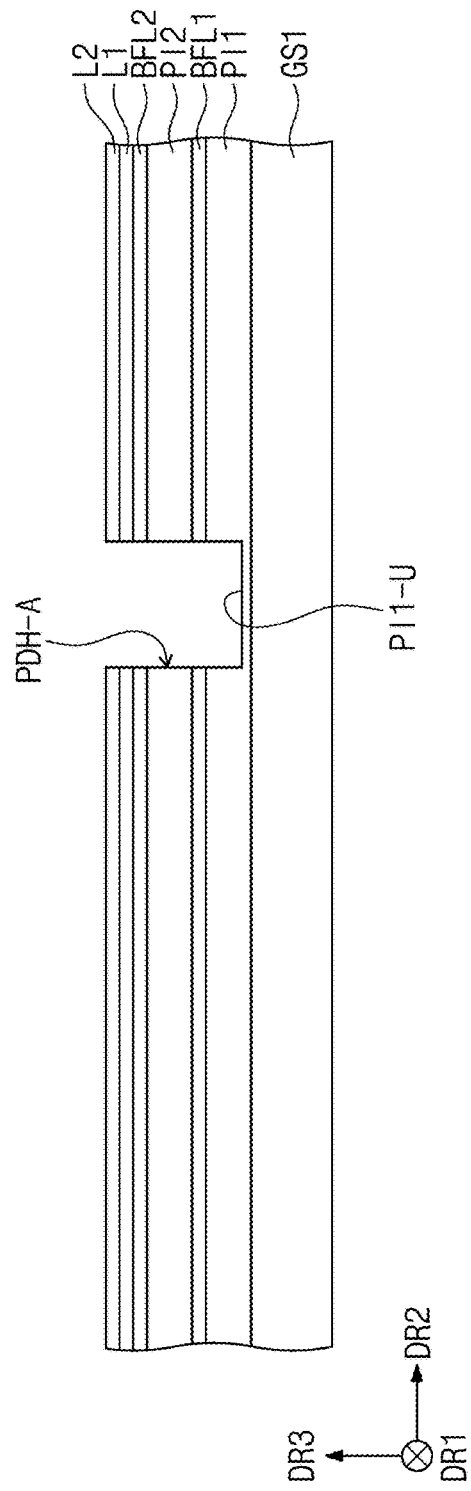
FIG. 11B is a cross-sectional view of a method for manufacturing a display panel according to an embodiment of the inventive concept.
Figure 11C:
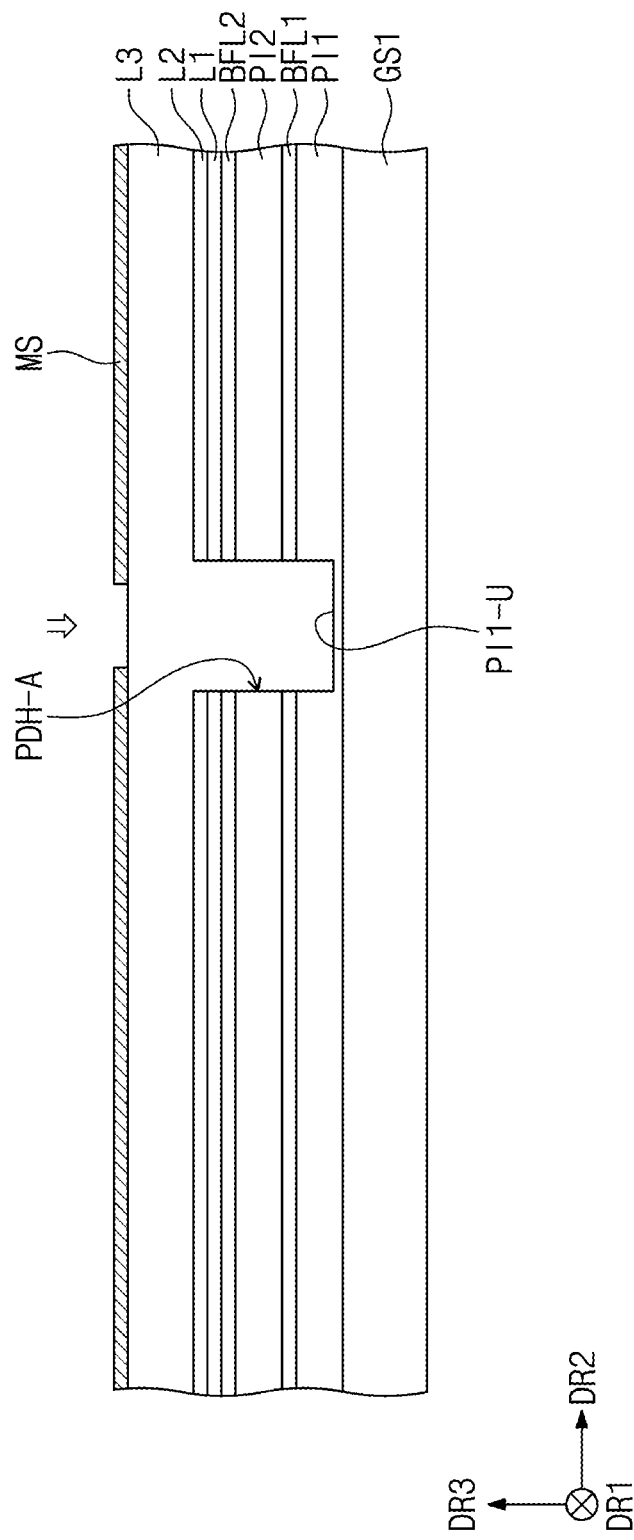
FIG. 11C is a cross-sectional view of a method for manufacturing a display panel according to an embodiment of the inventive concept.
Figure 11D:
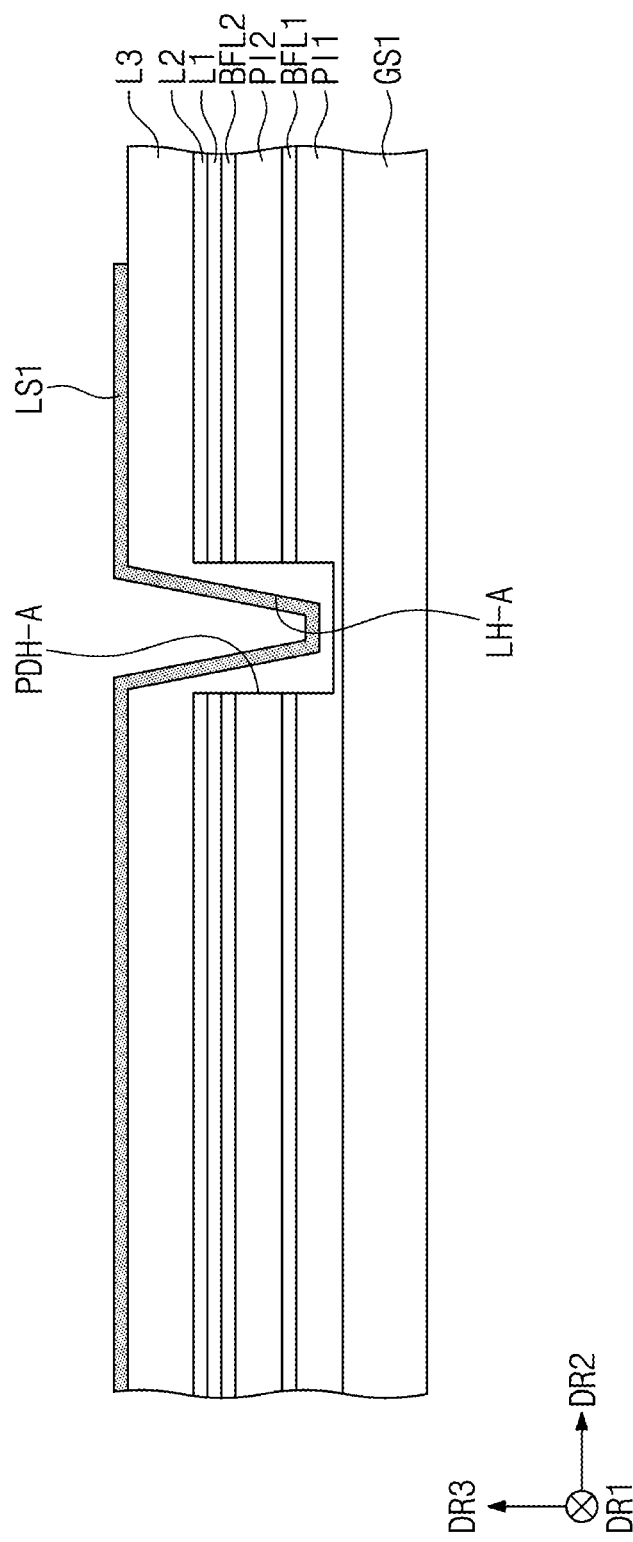
FIG. 11D is a cross-sectional view of a method for manufacturing a display panel according to an embodiment of the inventive concept.
Figure 11E:
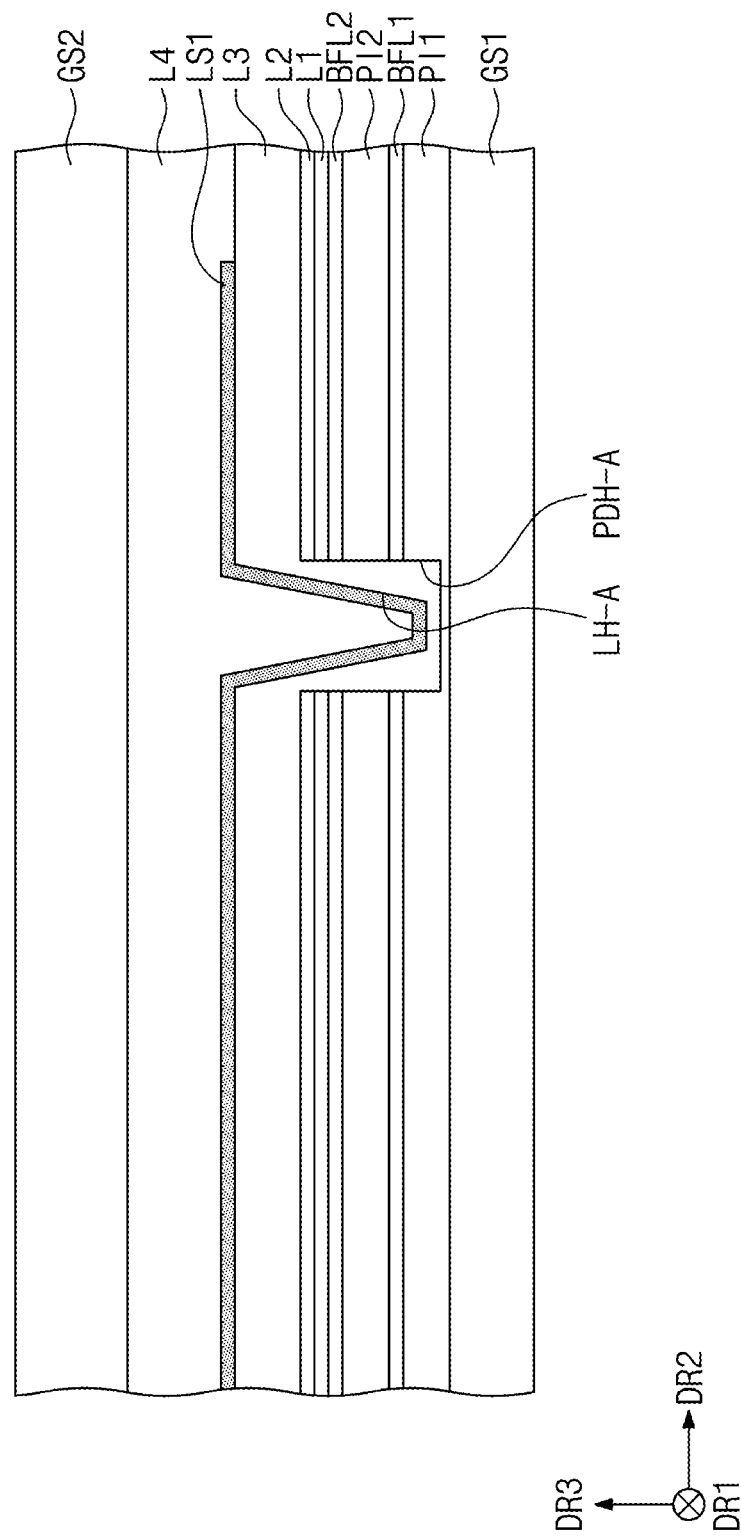
FIG. 11E is a cross-sectional view of a method for manufacturing a display panel according to an embodiment of the inventive concept.
Figure 11F:
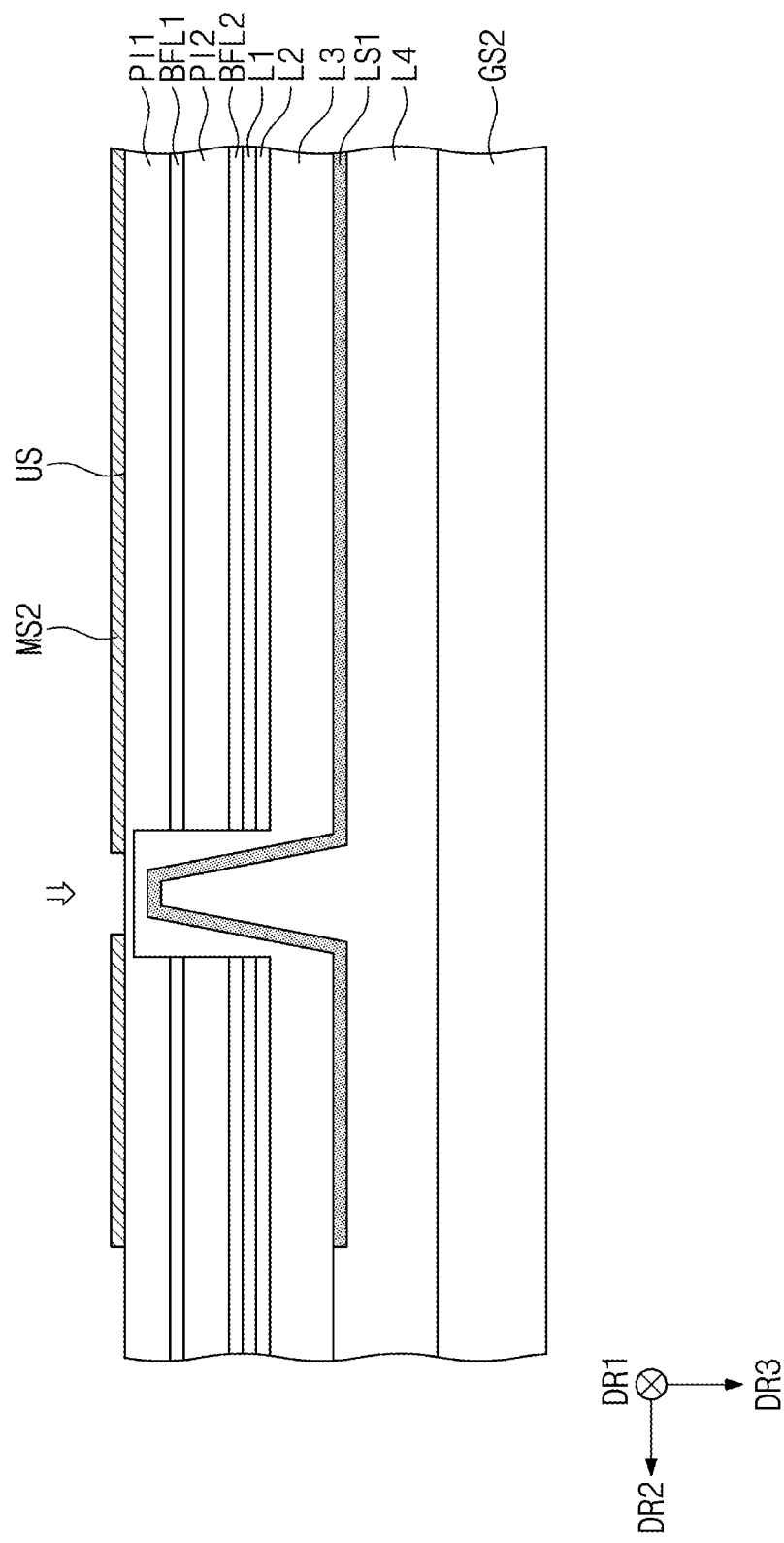
FIG. 11F is a cross-sectional view of a method for manufacturing a display panel according to an embodiment of the inventive concept.
Figure 11G:
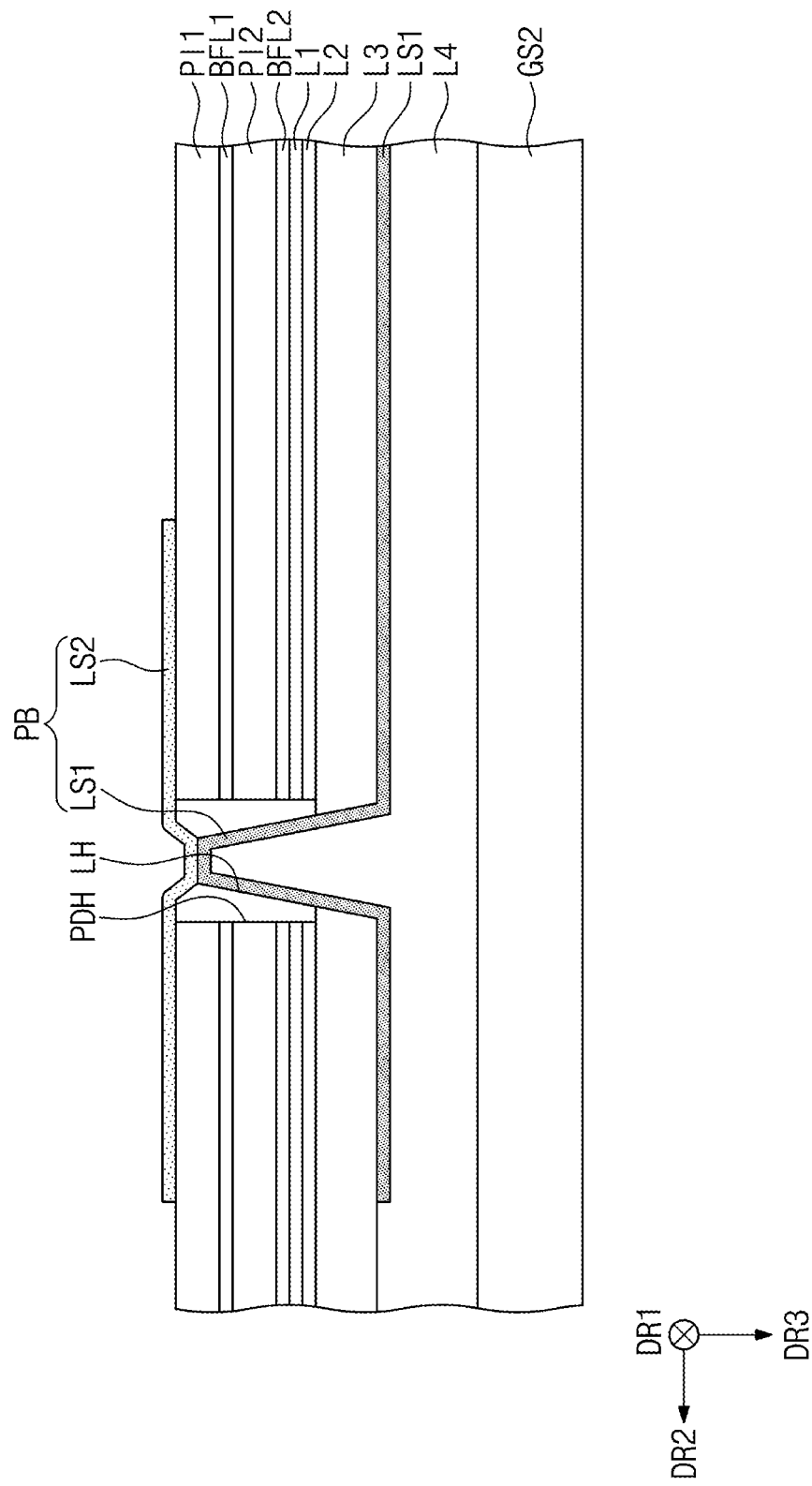
FIG. 11G is a cross-sectional view of a method for manufacturing a display panel according to an embodiment of the inventive concept.

FIG. 11A is a cross-sectional view of a method for manufacturing a display panel according to an embodiment of the inventive concept. FIG. 11B is a cross-sectional view of a method for manufacturing a display panel according to an embodiment of the inventive concept. FIG. 11C is a cross-sectional view of a method for manufacturing a display panel according to an embodiment of the inventive concept. FIG. 11D is a cross-sectional view of a method for manufacturing a display panel according to an embodiment of the inventive concept. FIG. 11E is a cross-sectional view of a method for manufacturing a display panel according to an embodiment of the inventive concept. FIG. 11F is a cross-sectional view of a method for manufacturing a display panel according to an embodiment of the inventive concept. FIG. 11G is a cross-sectional view of a method for manufacturing a display panel according to an embodiment of the inventive concept. FIG. 11H is a cross-sectional view of a method for manufacturing a display panel according to an embodiment of the inventive concept. For the same/like configurations as ones in FIGS. 1 to 9, the same/like reference numerals are given and duplicate descriptions are omitted. FIGS. 11F to 11H are upside-down views compared to FIGS. 11A to 11E.

Referring to FIG. 11A, a method for manufacturing a display panel according to the inventive concept may include providing a first work substrate. The providing of the first work substrate GS1 may be provided by forming a base layer and a plurality of insulating layers L1 and L2 on the first work substrate GS1. The base layer may be formed by sequentially placing a first organic insulating layer PI1, a first inorganic insulating layer BFL1, a second organic insulating layer PI2, and a second inorganic insulating layer BFL2 along the third direction DR3.

In the present embodiment, the base layer is described using the same configuration as the base layer BL-1 described in FIG. 9, but the method for manufacturing a display panel which will be described later may be equally applied to the base layer BL shown in FIG. 8.

Thereafter, referring to FIG. 11B, the method for manufacturing a display panel according to the inventive concept may include forming a pad hole. A pad hole PDH-A may be formed by removing a portion of the insulating layers L1 and L2 and the base layer.

In an embodiment, for example, the pad hole PDH-A passing through the insulating layers L1 and L2, the second inorganic insulating layer BFL2, the second organic insulating layer PI2, and the first inorganic insulating layer BFL1, and a portion of the first insulating layer PI1 is formed by collectively etching the insulating layers L1 and L2 and the base layer together so as to expose an inner surface PI1-U of the first organic insulating layer PI1.

Thereafter, referring to FIGS. 11C and 11D, the method for manufacturing a display panel according to the inventive concept may include filling the pad hole with an organic layer. The organic layer L3 may correspond to the third insulating layer L3 described in FIG. 6A.

Then, the method for manufacturing a display panel according to the inventive concept may include forming an insulating hole. An insulating hole LH-A may be formed by disposing a mask MS on the organic layer L3 and then etching a portion of the organic layer L3 through an opening of the mask MS defined in an area overlapping the pad hole PDH-A in a plan view. In this case, the insulating hole LH-A may cover the pad hole PDH-A and be defined to prevent the inner surface PI1-U of the first organic insulating layer PI1 from being exposed. That is, the insulating hole LH-A is defined such that the thickness (in the thickness direction DR3) of a portion of the organic layer L3 between the bottom of the insulating hole LH-A and the inner surface PI1-U is not zero.

Thereafter, the method for manufacturing a display panel according to the inventive concept may include forming a connection line. A connection line LS1 may be formed by applying a conductive material to cover an upper surface of the organic layer L3 and the insulating hole LH. In this case, the conductive material may be formed on the organic layer L3 through a sputtering process.

In the present embodiment, the connection line LS1 may be formed in the same layer as the control electrodes CE1 and CE2 and the input electrodes IE1 and 1E2 of the transistors TR1 and TR2 illustrated in FIG. 6A. That is, the connection line LS1 may be formed on the third insulating layer L3 and formed through the same process as the control electrodes CE1 and CE2, and the input electrodes IE1 and IE2, and thus, the connection line LS1 may include the same material as the control electrodes CE1 and CE2, and the input electrodes IE1 and IE2.

Then, referring to FIG. 11E, the method for manufacturing a display panel according to the inventive concept may further include forming a planarization layer and a second work substrate, and removing the first work substrate.

A planarization layer L4 may be formed on the organic layer L3. The planarization layer L4 may be provided as multiple layers. For example, the planarization layer L4 may be defined to include at least any one of the insulating layers disposed on the third insulating layer L3 in FIG. 6A. The planarization layer L4 may provide a planar surface on which the second work substrate GS2 may be disposed.

Thereafter, in the removing of the first work substrate GS1, the first work substrate GS1 may be removed from the rear surface of the first organic insulating layer PI1. Accordingly, the rear surface of the first organic insulating layer PI1 may be exposed.

Then, referring to FIG. 11F, the method for manufacturing a display panel according to the inventive concept may include removing the base layer and the organic layer. In this case, the first organic insulating layer PI1 and the portion of the organic layer L3 filling the pad hole PDH may be etched to expose the connection line LS1.

Thereafter, referring to FIG. 11G, the method for manufacturing a display panel according to the inventive concept may include forming a pad line. A pad line LS2 may be formed by applying a conductive material to cover the rear surface of the first organic insulating layer PI1 and the insulating hole LH. In this case, the conductive material may be formed on the first organic insulating layer PH through a sputtering process.

According to the method for manufacturing a display panel according to the inventive concept, the connection line LS1 and the pad line LS2 forming the pad unit PB may be in contact with each other inside the insulating hole LH.

Thereafter, referring to FIG. 11H, the method for manufacturing a display panel according to the inventive concept may further include bonding a driving unit.

The driving unit DB may be bonded to the pad line LS2 on the rear surface of the first organic insulating layer PI1. In this case, a pad (not shown) of the flexible circuit board FPCB of the driving unit DB may be bonded to the pad line LS2 through an anisotropic conductive film ACF.

In a display panel according to the inventive concept, a driving unit is disposed on a rear surface of the display panel overlapping an active area, and may thus a separate space for bonding the driving unit to a front surface of the display panel may be omitted. Accordingly, the width of a boundary between adjacent active areas is reduced, thereby improving an issue that the boundary is viewed by a user, and thus the display panel having improved aesthetics may be provided.

Although the inventive concept has been described with reference to a preferred embodiment of the inventive concept, it will be understood that the inventive concept should not be limited to these preferred embodiments but various changes and modifications can be made by those skilled in the art without departing from the spirit and scope of the inventive concept.

Accordingly, the technical scope of the inventive concept is not intended to be limited to the contents set forth in the detailed description of the specification, but is intended to be defined by the appended claims.

What is claimed is:

1. A display panel comprising:
    a display unit including an active area displaying an image; and
    a driving unit connected to the display unit,
    wherein the display unit comprises:
        a base layer including a front surface and a rear surface opposing each other;
        a circuit element layer disposed on the front surface of the base layer and including a plurality of insulating layers and a transistor having a plurality of electrodes disposed between the insulating layers;
        a display element layer disposed on the circuit element layer and including a light emitting element connected to the transistor; and
        a pad unit including a connection line branched from an electrode of the plurality of electrodes and a pad line connected to the driving unit,
    the display unit defines a pad hole passing through the base layer and at least one insulating layer of the plurality of insulating layers,
    a third insulating layer of the plurality of insulating layers covers a side surface of the at least one insulating layer defining the pad hole, is different from the at least one insulating layer, and defines an insulating hole passing through the third insulating layer,
    the third insulating layer is in direct contact with an upper surface and the side surface of the at least one insulating layer and a side surface of the base layer defining the pad hole, and
    the connection line and the pad line are in contact with each other inside the insulating hole.

2. The display panel of claim 1, wherein the pad line is disposed on the rear surface of the base layer.

3. The display panel of claim 1, wherein an angle between a virtual line parallel to an upper surface of the third insulating layer and a side surface of the third insulating layer defining the insulating hole is about 50 degrees (°) to about 80°.

4. The display panel of claim 1, wherein the connection line extends along a shape of the insulating hole, and
    among the plurality of insulating layers, a fourth insulating layer disposed on the third insulating layer fills a space on the connection line and inside the insulating hole.

5. The display panel of claim 1, wherein the connection line is filled inside the insulating hole.

6. The display panel of claim 1, wherein the base layer comprises an organic insulating layer containing an organic material, and an inorganic insulating layer disposed on the organic insulating layer and containing an inorganic material, and
    a side surface of the organic insulating layer and a side surface of the inorganic insulating layer, which define the pad hole, are aligned with each other.

7. The display panel of claim 1, wherein the base layer comprises:
    a first organic insulating layer and a second organic insulating layer which include an organic material; and
    a first inorganic insulating layer and a second inorganic insulating layer which include an inorganic material,
    the first inorganic insulating layer is disposed between the first organic insulating layer and the second organic insulating layer, and the second inorganic insulating layer is disposed on the second organic insulating layer, and
    a side surface of the first organic insulating layer, a side surface of the first inorganic insulating layer, a side surface of the second organic layer, and a side surface of the second inorganic insulating layer, which define the pad hole, are aligned with one another.

8. The display panel of claim 1, wherein the pad unit and the driving unit are connected in the rear surface of the base layer overlapping the active area.

9. The display panel of claim 1, wherein the driving unit is provided in plurality in the display unit, and
    the display unit is provided in plurality to be arranged along a first direction and a second direction crossing the first direction.

10. The display panel of claim 9, further comprising a cover layer which seals the display element layer and the circuit element layer,
    wherein the cover layer is filled between the plurality of display units.

11. The display panel of claim 1, further comprising a light control layer disposed on the display element layer,
    wherein the light control layer includes a color control layer and a color filter layer, the color control layer is configured to control a wavelength of light generated from the light emitting element and contains quantum dots, and the color filter layer is disposed on the color control layer and configured to transmit the controlled light.

12. The display panel of claim 1, wherein the display element layer further comprises:
    a first partition wall and a second partition wall which are disposed on the circuit element layer, each extending in a first direction, and spaced apart along a second direction crossing the first direction;
    a first electrode disposed on the first partition wall and connected to the transistor;
    a second electrode disposed on the second partition wall; and
    the light emitting element.

13. The display panel of claim 12, wherein the light emitting element is disposed between the first partition wall and the second partition wall, and connected to the first electrode and the second electrode.

14. The display panel of claim 1, wherein the display element layer further comprises:
    a pixel defining film disposed on the circuit element layer and defining a display opening;
    a first electrode at least partially exposed by the display opening;
    a hole control layer disposed on the first electrode;
    the light emitting element disposed on the first electrode;
    a second electrode disposed on the light emitting element; and
    an encapsulation layer which covers the second electrode.

15. The display panel of claim 14, wherein the light emitting element is an organic light emitting element.

\* \* \* \* \*